(12) United States Patent
Wang et al.

(10) Patent No.: US 12,238,991 B2
(45) Date of Patent: Feb. 25, 2025

(54) DISPLAY SUBSTRATE COMPRISING SUB-PIXELS IN FAN-OUT WIRING REGION AND PREPARATION METHOD THEREFOR

(71) Applicants: Chengdu BOE Optoelectronics Technology Co., Ltd., Sichuan (CN); BOE Technology Group Co., Ltd., Beijing (CN)

(72) Inventors: Rong Wang, Beijing (CN); Xiangdan Dong, Beijing (CN); Donghui Tian, Beijing (CN); Fan He, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/772,151

(22) PCT Filed: May 21, 2021

(86) PCT No.: PCT/CN2021/095038
§ 371 (c)(1),
(2) Date: Apr. 27, 2022

(87) PCT Pub. No.: WO2022/241747
PCT Pub. Date: Nov. 24, 2022

(65) Prior Publication Data
US 2024/0147785 A1    May 2, 2024

(51) Int. Cl.
*H10K 59/131*    (2023.01)

(52) U.S. Cl.
CPC .................. *H10K 59/131* (2023.02)

(58) Field of Classification Search
None
See application file for complete search history.

(56) References Cited

U.S. PATENT DOCUMENTS

2014/0117320 A1    5/2014  Jung
2020/0388230 A1*  12/2020  Lee ...................... G09G 3/3275
(Continued)

FOREIGN PATENT DOCUMENTS

| CN | 109541865 A | 3/2019 |
| CN | 110491915 A | 11/2019 |

(Continued)

*Primary Examiner* — Nduka E Ojeh
(74) *Attorney, Agent, or Firm* — Ling Wu; Stephen Yang; Ling and Yang Intellectual Property

(57) ABSTRACT

A display substrate and a preparation method therefor, and a display apparatus are provided. The display substrate includes a display area and a non-display area surrounding the display area, the display area including a first display region, a second display region and a fan-out wiring region, the second display region being located between the first display region and the fan-out wiring region; the first display region including a plurality of first sub-pixels, the first sub-pixel including a first pixel circuit and a first light emitting element; the second display region including a plurality of second sub-pixels, the second sub-pixel including a second pixel circuit and a second light emitting element; the fan-out wiring region including a plurality of data fan-out lines and a plurality of third sub-pixels, the third sub-pixel including a third light emitting element.

20 Claims, 10 Drawing Sheets

(56) References Cited

U.S. PATENT DOCUMENTS

2021/0096615 A1    4/2021  Hu et al.
2022/0392964 A1*  12/2022  Wu ..................... H10K 59/121

FOREIGN PATENT DOCUMENTS

| | | |
|---|---|---|
| CN | 111584587 A | 8/2020 |
| CN | 111897167 A | 11/2020 |
| CN | 212516405 U | 2/2021 |

* cited by examiner

DISPLAY SUBSTRATE COMPRISING SUB-PIXELS IN FAN-OUT WIRING REGION AND PREPARATION METHOD THEREFOR

CROSS-REFERENCE TO RELATED APPLICATION

The present application is a U.S. National Phase Entry of International Application No. PCT/CN2021/095038 having an international filing date of May 21, 2021. The above-identified application is hereby incorporated by reference.

TECHNICAL FIELD

The present disclosure relates to, but is not limited to, the field of display technology, and more particularly, to a display substrate and a preparation method therefor, and a display apparatus.

BACKGROUND

An Organic Light Emitting Diode (OLED) and a Quantum-dot Light Emitting Diode (QLED) are active light emitting display devices, which have the advantages of self-luminescence, a wide viewing angle, high contrast, low power consumption, an extremely high response speed, lightness and thinness, bendability, a low cost, etc. With the continuous development of the display technology, Flexible Displays with OLEDs or QLEDs as light emitting devices and using Thin Film Transistors (TFTs) for signal control have become mainstream products in the field of display at present.

SUMMARY

The following is a summary of subject matter described herein in detail. The summary is not intended to limit the protection scope of the claims.

An embodiment of the present disclosure provides a display substrate, including a display area and a non-display area surrounding the display area, the display area including a first display region, a second display region and a fan-out wiring region, the second display region being located between the first display region and the fan-out wiring region; a plurality of data lines located in the display area; the first display region including a plurality of first sub-pixels, the first sub-pixel including a first pixel circuit and a first light emitting element, and an orthographic projection of the first pixel circuit on the display substrate at least being partially overlapped with an orthographic projection of the first light emitting element on the display substrate; the second display region including a plurality of second sub-pixels, the second sub-pixel including a second pixel circuit and a second light emitting element, and an orthographic projection of the second pixel circuit on the display substrate at least being partially overlapped with an orthographic projection of the second light emitting element on the display substrate; the first pixel circuit and the second pixel circuit being electrically connected with the plurality of data lines; and the fan-out wiring region including a plurality of data fan-out lines and a plurality of third sub-pixels, the third sub-pixel including a third light emitting element, at least one second pixel circuit being electrically connected with at least two light emitting elements, the at least two light emitting elements being selected from at least one of the second light emitting element and the third light emitting element, and the plurality of data fan-out lines being electrically connected with the plurality of data lines.

In an exemplary implementation, the orthographic projection of the second pixel circuit on a display substrate plane is not overlapped with an orthographic projection of the third light emitting element on the display substrate plane.

In an exemplary implementation, the data fan-out lines are stepped wiring, and an orthographic projection of the data fan-out line on the display substrate plane is not overlapped with orthographic projections of the first pixel circuit and the second pixel circuit on the display substrate plane.

In an exemplary implementation, the display area includes a first connecting line and a second connecting line, the first connecting line is configured to connect at least one of: the first pixel circuit and an anode of the first light emitting element, the second pixel circuit and an anode of the second light emitting element, and the second pixel circuit and an anode of the third light emitting element; and the second connecting line is configured to connect anodes of the at least two light emitting elements.

In an exemplary implementation, materials of the first connecting line and the second connecting line are transparent conductive materials.

In an exemplary implementation, the fan-out wiring region includes a first color light emitting element, a second color light emitting element and a third color light emitting element, and the second connecting line is configured to connect anodes of at least two third color light emitting elements.

In an exemplary implementation, the third color light emitting element is a green light emitting element.

In an exemplary implementation, the third sub-pixel further includes a third pixel circuit, and an orthographic projection of the third pixel circuit on the display substrate is at least partially overlapped with an orthographic projection of the first color light emitting element or the second color light emitting element on the display substrate, and is not overlapped with an orthographic projection of the third color light emitting element on the display substrate.

In an exemplary implementation, the second connecting line is further configured to connect at least one of: anodes of at least two first color light emitting elements, and anodes of at least two second color light emitting elements.

In an exemplary implementation, the data fan-out line includes at least one transverse connecting portion and at least one longitudinal connecting portion, an orthographic projection of the transverse connecting portion on the display substrate plane is not overlapped with the orthographic projection of the third light emitting element on the display substrate plane, and there is at least an overlapping area between an orthographic projection of the longitudinal connecting portion on the display substrate plane and the orthographic projection of the third light emitting element on the display substrate plane.

In an exemplary implementation, the at least one second pixel circuit being electrically connected with at least two light emitting elements includes any one or more of the following: two light emitting elements being connected in series and then connected with one second pixel circuit, the two light emitting elements being selected from at least one of the second light emitting element and the third light emitting element; three light emitting elements being connected in series and then connected with one second pixel circuit, the three light emitting elements being selected from at least one of the second light emitting element and the third light emitting element; four light emitting elements being connected in series and then connected with one second pixel circuit, the four light emitting elements being selected from at least one of the second light emitting element and the third light emitting element; and five light emitting elements being connected in series and then connected with one second pixel circuit, the five light emitting elements being selected from at least one of the second light emitting element and the third light emitting element.

In an exemplary implementation, the display substrate includes a semiconductor layer, a first gate electrode layer, a second gate electrode layer, a first source-drain electrode layer, a second source-drain electrode layer, and an anode stacked on a substrate, wherein: the semiconductor layer includes active layers of a plurality of transistors, the first gate electrode layer includes gate electrodes of a plurality of transistors and a plurality of first capacitor electrodes, the second gate electrode layer includes a plurality of second capacitor electrodes, the first source-drain electrode layer includes a plurality of data lines, and source electrodes and drain electrodes of a plurality of transistors, and the second source-drain electrode layer includes a connecting electrode; and the plurality of data fan-out lines are arranged in the same layer as one or more of the first gate electrode layer, the second gate electrode layer and the second source-drain electrode layer.

In an exemplary implementation, the display substrate includes a light shielding layer, a first semiconductor layer, a first gate electrode layer, a second gate electrode layer, a second semiconductor layer, a third gate electrode layer, a source-drain electrode layer, and an anode stacked on a substrate, wherein: the first semiconductor layer includes an active layer of at least one polysilicon transistor, the first gate electrode layer includes a gate electrode of at least one polysilicon transistor and a plurality of first capacitor electrodes, the second gate electrode layer includes a plurality of second capacitor electrodes, the second semiconductor layer includes an active layer of at least one oxide transistor, the third gate electrode layer includes a gate electrode of at least one oxide transistor, and the source-drain electrode layer includes a plurality of data lines, and source electrodes and drain electrodes of a plurality of transistors; and the plurality of data fan-out lines are arranged in the same layer as one or more of the light shielding layer, the first gate electrode layer, the second gate electrode layer and the third gate electrode layer.

In an exemplary implementation, the display substrate further includes an electrode connecting layer arranged between the source-drain electrode layer and the anode, and a material of the electrode connecting layer is indium tin oxide or indium zinc oxide.

In an exemplary implementation, at least one third sub-pixel includes any one or more of the following dummy electrode lines: a dummy active layer, a dummy gate electrode, a dummy capacitor electrode, and a dummy source-drain electrode, the dummy electrode lines being connected to a fixed potential signal line through a signal line.

In an exemplary implementation, at least one third sub-pixel includes a dummy data fan-out line connected to a fixed potential signal line through a signal line.

An embodiment of the present disclosure further provides a display apparatus, including the display substrate described in any of the above implementations.

An embodiment of the present disclosure further provides a method for preparing a display substrate, the display substrate including a display area and a non-display area surrounding the display area, the display area including a first display region, a second display region and a fan-out wiring region, the second display region being located between the first display region and the fan-out wiring region; the method including: forming a plurality of first sub-pixels in the first display region, a first sub-pixel including a first pixel circuit and a first light emitting element, an orthographic projection of the first pixel circuit on the display substrate at least being partially overlapped with an orthographic projection of the first light emitting element on the display substrate; forming a plurality of second sub-pixels in the second display region, a second sub-pixel including a second pixel circuit and a second light emitting element, an orthographic projection of the second pixel circuit on the display substrate at least being partially overlapped with an orthographic projection of the second light emitting element on the display substrate, the first pixel circuit and the second pixel circuit being electrically connected with a plurality of data lines; forming a plurality of third sub-pixels and a plurality of data fan-out lines in the fan-out wiring region, a third sub-pixel including a third light emitting element, at least one second pixel circuit being electrically connected with at least two light emitting elements, the at least two light emitting elements being selected from at least one of the second light emitting element and the third light emitting element, and the plurality of data fan-out lines being electrically connected with the plurality of data lines.

Other aspects may be comprehended upon reading and understanding the drawings and the detailed description.

BRIEF DESCRIPTION OF DRAWINGS

Accompanying drawings are used for providing a further understanding of technical solutions of the present disclosure and form a part of the specification, are used for explaining the technical solutions of the present disclosure together with embodiments of the present disclosure, and do not constitute a limitation on the technical solutions of the present disclosure. The shape and size of each component in the drawings do not reflect the true scale, but are only intended to schematically describe the contents of the present disclosure.

DETAILED DESCRIPTION

Figure 1:
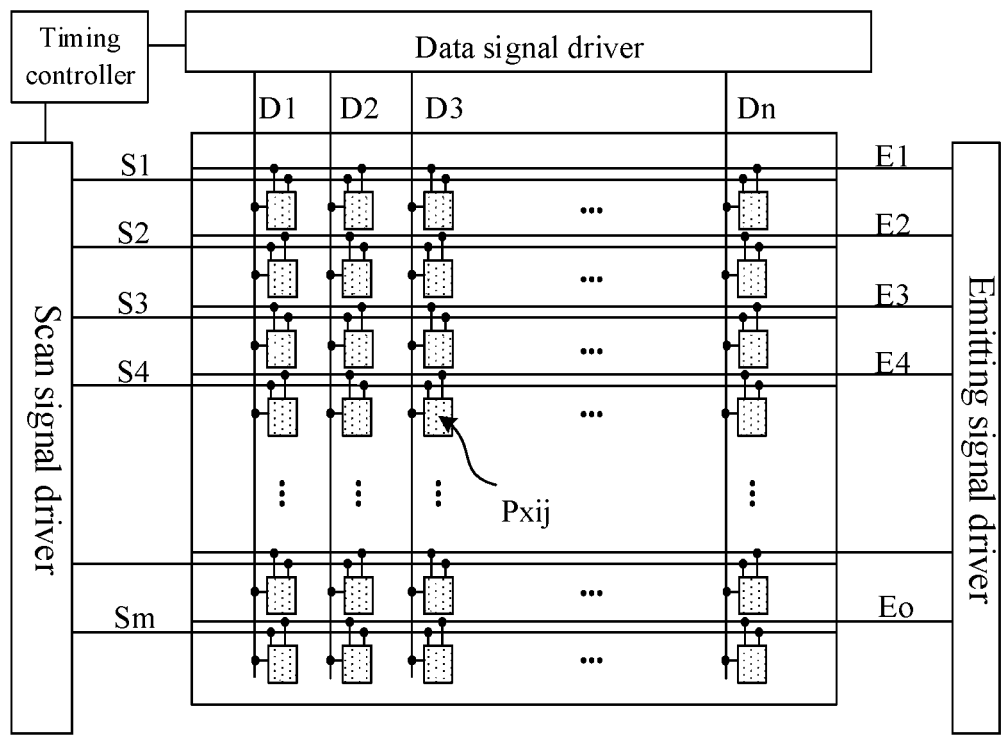
FIG. 1 is a schematic diagram of a structure of a display apparatus.

In order to make the objects, technical solutions and advantages of the present disclosure more clear, the embodiments of the present disclosure will be described in detail below in conjunction with the drawings. It is to be noted that implementations may be carried out in multiple different forms. Those of ordinary skills in the art may easily understand such a fact that modes and contents may be transformed into various forms without departing from the spirit and scope of the present disclosure. Therefore, the present disclosure should not be construed as being only limited to the contents recorded in the following implementations. The embodiments in the present disclosure and features in the embodiments may be combined randomly with each other if there is no conflict. In order to keep the following description of the embodiments of the present disclosure clear and concise, detailed descriptions about part of known functions and known components are omitted in the present disclosure. The drawings of the embodiments of the present disclosure only involve the structures involved in the embodiments of the present disclosure, and for the other structures, reference may be made to conventional designs.

In the accompanying drawings, a size of each constituent element, a thickness of a layer, or a region may be exaggerated sometimes for clarity. Therefore, one mode of the present disclosure is not necessarily limited to the size, and the shape and size of each component in the accompanying drawings do not reflect true scale. In addition, the accompanying drawings schematically show ideal examples, and one mode of the present disclosure is not limited to a shape, a numerical value, or the like shown in the accompanying drawings.

Ordinal numerals such as "first", "second", "third" and the like in the specification are set to avoid confusion of the constituent elements, but not to set a limit in quantity.

In the specification, for convenience, wordings indicating orientations or positional relationships, such as "center", "upper", "lower", "front", "back", "vertical", "horizontal", "top", "bottom", "inside" and "outside", are used for describing positional relationships between constituent elements with reference to the drawings, and are merely for facilitating describing the specification and simplifying the description, rather than indicating or implying that referred apparatuses or elements must have particular orientations, and be constructed and operated in particular orientations. Thus, they cannot be construed as limitations on the present disclosure. The positional relationships between the constituent elements are appropriately changed according to directions in which the constituent elements are described. Therefore, they are not limited to the wordings described in the specification, but may be replaced appropriately according to situations.

In the specification, unless otherwise specified and defined explicitly, the terms "install", "link" and "connect" should be understood in a broad sense. For example, they may be a fixed connection, or a detachable connection, or an integral connection; may be a mechanical connection or an electrical connection; may be a direct connection, or an indirect connection through an intermediary, or an internal communication between two elements. Those of ordinary skills in the art may understand the meanings of the above terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. It is to be noted that in the specification, the channel region refers to a region which the current mainly flows through.

In the specification, a first electrode may be a drain electrode and a second electrode may be a source electrode; or, a first electrode may be a source electrode and a second electrode may be a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" may be exchanged in the specification.

In the specification, an "electric connection" includes a case where constituent elements are connected together through an element having a certain electric function. There is no specific restriction on the "element having a certain electric function" as long as it allows transmitting and receiving of electrical signals between connected constituent elements. Examples of the "element having a certain electric function" includes not only an electrode and a wiring, but also a switching element such as a transistor, a resistor, an inductor, a capacitor, and other elements having various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, "film" and "layer" are interchangeable. For example, sometimes a "conductive layer" may be replaced with a "conductive film". Similarly, sometimes an "insulating film" may be replaced with an "insulating layer".

In the present disclosure, "about" refers to that a boundary is defined not so strictly and numerical values in process and measurement error ranges are allowed.

FIG. 1 is a schematic diagram of a structure of a display apparatus. As shown in FIG. 1, an OLED display apparatus may include a timing controller, a data signal driver, a scan signal driver, an emitting signal driver, and a pixel array. The pixel array may include a plurality of scan signal lines (S1 to Sm), a plurality of data lines (D1 to Dn), a plurality of emitting signal lines (E1 to Eo), and a plurality of sub-pixels Pxij. In an exemplary implementation, the timing controller may provide a gray-scale value and a control signal suitable for a specification of the data signal driver to the data signal driver, provide a clock signal, a scan start signal, etc., suitable for a specification of the scan signal driver to the scan signal driver, and provide a clock signal, a transmit stop signal, etc., suitable for a specification of the emitting signal driver to the emitting signal driver. The data signal driver may generate a data voltage to be provided to the data lines D1, D2, D3, ..., and Dn, by using the gray-scale value and the control signal received from the timing controller. For example, the data signal driver may sample the gray-scale value using the clock signal and apply a data voltage corresponding to the gray-scale value to the data lines D1 to Dn by taking a pixel row as a unit, where n may be a natural number. The scan signal driver may generate a scan signal to be provided to the scan signal lines S1, S2, S3, ..., and Sm, by receiving the clock signal, the scan start signal, etc. from the timing controller. For example, the scan signal driver may sequentially provide a scan signal with an on-level pulse to the scan signal lines S1 to Sm. For example, the scan signal driver may be structured in a form of a shift register and sequentially transmit a scan start signal provided in the form of on-level pulse to a next-stage circuit under the control of the clock signal to generate the scan signal. Herein, m may be a natural number. The emitting signal driver may generate a transmit signal to be provided to the emitting signal lines E1, E2, E3, ..., and Eo, by receiving the clock signal, the transmit stop signal, etc. from the timing controller. For example, the emitting signal driver may sequentially provide a transmit signal with an off-level pulse to the emitting signal lines E1 to Eo. For example, the emitting signal driver may be structured in a form of a shift register and sequentially transmit an emitting stop signal provided in the form of off-level pulse to a next-stage circuit under the control of the clock signal to generate the emitting signal. Herein, o may be a natural number. The pixel array may include a plurality of sub-pixels Pxij. Each sub-pixel Pxij may be connected to a corresponding data line, a corresponding scan signal line, and a corresponding emitting signal line, where i and j may be natural numbers. The sub-pixel Pxij may refer to a sub-pixel in which a transistor is connected to an ith scan signal line as well as a jth data line.

Figure 2:
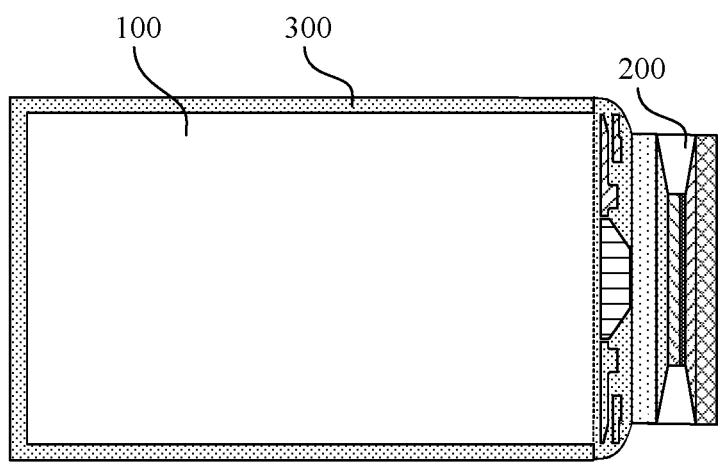
FIG. 2 is a schematic diagram of a planar structure of a display substrate.

FIG. 2 is a schematic diagram of a planar structure of a display substrate. As shown in FIG. 2, the display substrate may include a display area 100, a bonding area 200 on a side of the display area 100, and a bezel area 300 on other sides of the display area 100. The display area 100 may include a plurality of sub-pixels configured to display dynamic pictures or static images, the bonding area 200 may include data fan-out lines for connecting multiple data lines to an integrated circuit, and the bezel area 300 may include a power line for transmitting a voltage signal, and the bonding area 200 and the bezel area 300 may include an isolating dam with a circular structure. At least one side of the bezel area 300 may be a crimping region formed by bending, or both the display area 100 and the bezel area 300 are bending or crimping regions, and this is not limited in the present disclosure.

Figure 3:
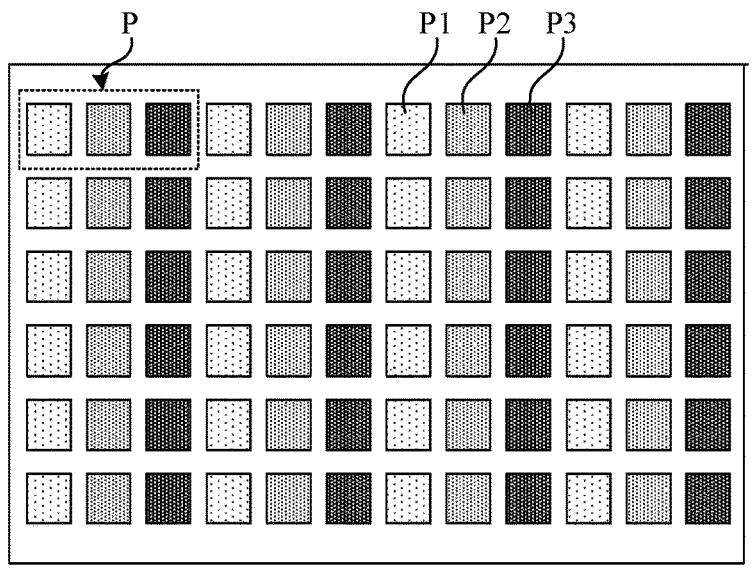
FIG. 3 is a schematic diagram of a planar structure of a display area in a display substrate.

In an exemplary implementation, the display area may include a plurality of pixel units arranged in a matrix. FIG. 3 is a schematic diagram of a planar structure of a display area in a display substrate. As shown in FIG. 3, the display substrate may include a plurality of pixel units P arranged in a matrix, at least one of the plurality of pixel units P includes a first color sub-pixel P1 emitting light of a first color, a second color sub-pixel P2 emitting light of a second color and a third color sub-pixel P3 emitting light of a third color, and the first color sub-pixel P1, the second color sub-pixel P2, and the third color sub-pixel P3 each include a pixel driving circuit and a light emitting device. The pixel driving circuit in each of the first color sub-pixel P1, the second color sub-pixel P2, and the third color sub-pixel P3 is connected to a scan signal line, a data line, and an emitting signal line. The pixel driving circuit is configured to, under the control of the scan signal line and the emitting signal line, receive a data voltage transmitted by the data line and output a corresponding current to the light emitting device. The light emitting device in the first color sub-pixel P1, the second color sub-pixel P2 and the third color sub-pixel P3 is connected respectively to the pixel driving circuit of the sub-pixel where the light emitting device is located, and the light emitting device is configured to emit light with a corresponding luminance in response to a current output by the pixel driving circuit of the sub-pixel where the light emitting device is located.

In an exemplary implementation, the pixel unit P may include a Red (R) sub-pixel, a Green (G) sub-pixel, and a Blue (B) sub-pixel, or may include a red sub-pixel, a green sub-pixel, a blue sub-pixel and a white sub-pixel, which is not limited in the present disclosure. In an exemplary implementation, a shape of the sub-pixel in the pixel unit may be a rectangle, a rhombus, a pentagon, or a hexagon. When the pixel unit includes three sub-pixels, the three sub-pixels may be arranged side by side horizontally, side by side vertically, or in the form like "Delta"; and when the pixel unit includes four sub-pixels, the four sub-pixels may be arranged side by side horizontally, side by side vertically, or in the shape of a square, which is not limited in the present disclosure.

Figure 4:
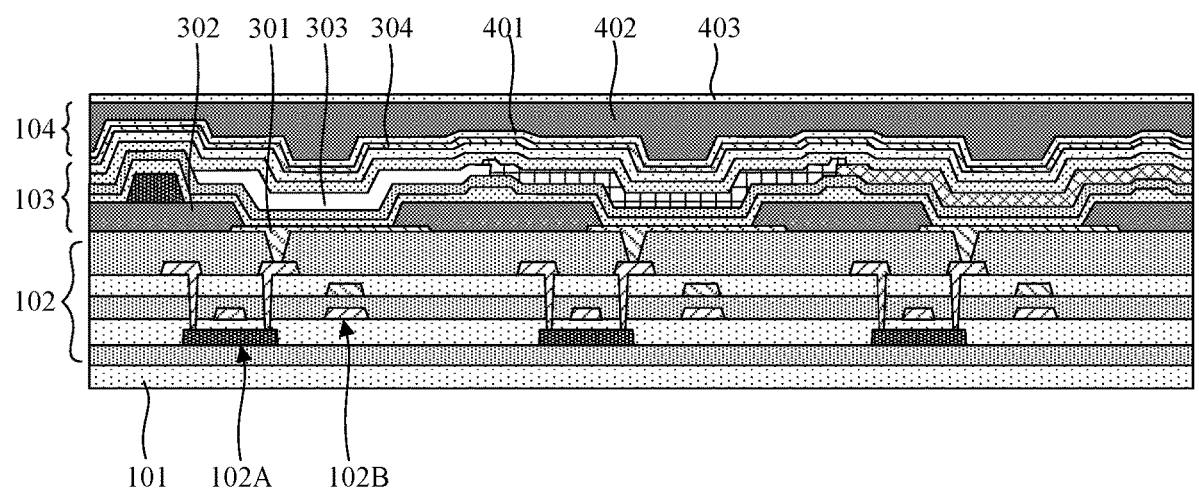
FIG. 4 is a schematic diagram of a sectional structure of a display area in a display substrate.

FIG. 4 is a schematic diagram of a sectional structure of a display area in a display substrate, illustrating the structure of three sub-pixels of an OLED display substrate. Referring to FIG. 4, on a plane perpendicular to the display substrate, the display substrate may include a driving circuit layer 102 disposed on a substrate 101, a light emitting structure layer 103 disposed on a side of the driving circuit layer 102 away from the substrate 101, and an encapsulation layer 104 disposed on a side of the light emitting structure layer 103 away from the substrate 101. In some possible implementations, the display substrate may include other film layers, such as a post spacer, which is not limited in the present disclosure herein.

In an exemplary implementation, the substrate 101 may be a flexible substrate or may be a rigid substrate. The driving circuit layer 102 of each sub-pixel may include a plurality of transistors and a storage capacitor that form a pixel driving circuit. FIG. 4 shows a sub-pixel only including one transistor 102A and one storage capacitor 102B as an example. The light emitting structure layer 103 may include an anode 301, a pixel definition layer 302, an organic light emitting layer 303, and a cathode 304. The anode 301 is connected to a drain electrode of a drive transistor 210 through a via hole. The organic light emitting layer 303 is connected to the anode 301. The cathode 304 is connected to the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, thus ensuring that external water vapor cannot enter the light emitting structure layer 103.

In an exemplary implementation, the organic light emitting layer 303 may include a hole injection layer (HIL), a hole transport layer (HTL), an electron block layer (EBL), an emitting layer (EML), a hole block layer (HBL), an electron transport layer (ETL) and an electron injection layer (EIL) that are stacked. In an exemplary implementation, the hole injection layers of all the sub-pixels may be connected together to form a through layer. The electron injection layers of all the sub-pixels may be connected together to form a through layer. The hole transport layers of all the sub-pixels may be connected together to form a through layer. The electron transport layers of all the sub-pixels may be connected together to form a through layer. The hole block layers of all the sub-pixels may be connected together to form a through layer. The emitting layers of adjacent sub-pixels may have a small overlap, or may be isolated from each other. The electron block layers of adjacent sub-pixels may have a small overlap, or may be isolated from each other.

Figure 5:
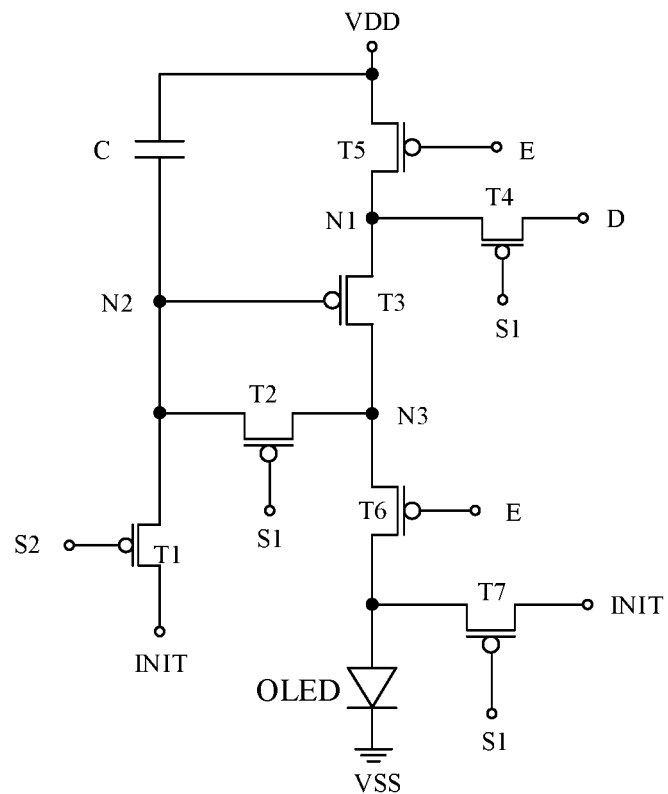
FIG. 5 is a schematic diagram of an equivalent circuit of a pixel driving circuit.

In an exemplary implementation, the pixel driving circuit may have a structure of 3T1C, 4T1C, 5T1C, 5T2C, 6T1C or 7T1C. FIG. 5 illustrates a schematic diagram of an equivalent circuit of a pixel driving circuit. As shown in FIG. 5, the pixel driving circuit may include seven transistors (a first transistor T1 to a seventh transistor T7), a storage capacitor C, and seven signal lines (a signal line D, a first scan signal line S1, a second scan signal line S2, an emitting signal line E, an initial signal line INIT, a first power line VDD, and a second power line VSS).

In an exemplary implementation, a first terminal of the storage capacitor C is connected with the first power line VDD. A second terminal of the storage capacitor C is connected with a second node N2, namely the second terminal of the storage capacitor C is connected with a control electrode of the third transistor T3.

A control electrode of the first transistor T1 is connected with the second scan signal line S2. A first electrode of the first transistor T1 is connected with the initial signal line INIT. A second electrode of the first transistor is connected with the second node N2. When an on-level scan signal is applied to the second scan signal line S2, the first transistor T1 transmits an initialization voltage to the control electrode of the third transistor T3 so as to initialize the quantity of electric charges of the control electrode of the third transistor T3.

A control electrode of the second transistor T2 is connected with the first scan signal line S1. A first electrode of the second transistor T2 is connected with the second node N2. A second electrode of the second transistor T2 is connected with a third node N3. When the on-level scan signal is applied to the first scan signal line S1, the second transistor T2 allows the control electrode of the third transistor T3 to be connected with the second electrode.

The control electrode of the third transistor T3 is connected with the second node N2, namely the control electrode of the third transistor T3 is connected with the second terminal of the storage capacitor C. A first electrode of the third transistor T3 is connected with a first node N1. A second electrode of the third transistor T3 is connected with the third node N3. The third transistor T3 may be referred to as a drive transistor. The third transistor T3 determines a magnitude of a drive current flowing between the first power line VDD and the second power line VSS according to a potential difference between the control electrode and first electrode of the third transistor T3.

A control electrode of the fourth transistor T4 is connected to the first scan signal line S1, a first electrode of the fourth transistor T4 is connected to the data line D, and a second electrode of the fourth transistor T4 is connected to the first node N1. The fourth transistor T4 may be referred to as a switch transistor, or a scan transistor, etc. When the on-level scan signal is applied to the first scan signal line S1, the fourth transistor T4 allows a data voltage of the data line D to be input to the pixel driving circuit.

A control electrode of the fifth transistor T5 is connected with the emitting signal line E. A first electrode of the fifth transistor T5 is connected with the first power line VDD. A second electrode of the fifth transistor T5 is connected with the first node N1. A control electrode of the sixth transistor T6 is connected with the emitting signal line E. A first electrode of the sixth transistor T6 is connected with the third node N3. A second electrode of the sixth transistor T6 is connected with a first electrode of a light emitting device. The fifth transistor T5 and the sixth transistor T6 may be referred to as emitting transistors. When an on-level emitting signal is applied to the emitting signal line E, the fifth transistor T5 and the sixth transistor T6 form a drive current path between the first power line VDD and the second power line VSS to drive the light emitting device to emit light.

A control electrode of the seventh transistor T7 is connected with the first scan signal line S1. A first electrode of the seventh transistor T7 is connected with the initial signal line INIT. A second electrode of the seventh transistor T7 is connected with the first electrode of the light emitting device. When the on-level scan signal is applied to the first scan signal line S1, the seventh transistor T7 transmits the initialization voltage to the first electrode of the light emitting device so as to initialize the quantity of electric charges accumulated in the first electrode of the light emitting device or release the electric charges accumulated in the first electrode of the light emitting device.

In an exemplary implementation, the second electrode of the light emitting device is connected to the second power line VSS, a signal of the second power line VSS is a low-level signal and a signal of the first power line VDD is a continuously provided high-level signal. The first scan signal line S1 is a scan signal line in the pixel driving circuit of a present display row, and the second scan signal line S2 is a scan signal line in the pixel driving circuit of a previous display row. That is, for an nth display row, the first scan signal line S1 is S (n), and the second scan signal line S2 is S (n–1). The second scan signal line S2 of the present display row and the first scan signal line S1 in the pixel driving circuit of the previous display row are the same signal line. Signal lines of the display panel may be reduced, so that the display panel with a narrow bezel is achieved.

In an exemplary implementation, the first transistor T1 to the seventh transistor T7 may be P-type transistors or N-type transistors. Using the same type of transistors in the pixel driving circuit may simplify the process flow, reduce the process difficulty of a display panel, and improve the product yield. In some possible implementations, the first transistor T1 to the seventh transistor T7 may include P-type transistors and N-type transistors.

In an exemplary implementation, the first scan signal line S1, the second scan signal line S2, the emitting signal line E, and the initial signal line INIT extend horizontally, and the second power line VSS, the first power line VDD, and the data line D extend vertically.

In an exemplary implementation, the light emitting device may be an organic light emitting device (OLED), and includes a first electrode (anode), an organic light emitting layer, and a second electrode (cathode) that are stacked.

Figure 6:
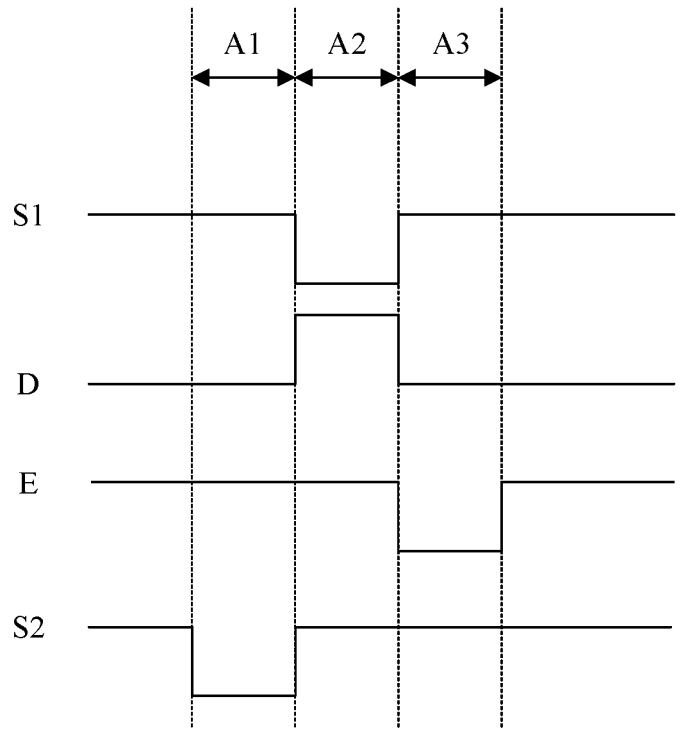
FIG. 6 is a working timing diagram of a pixel driving circuit.

FIG. 6 is a working timing diagram of a pixel driving circuit. An exemplary embodiment of the present disclosure will be described below through a working process of the pixel driving circuit shown in FIG. 5. The pixel driving circuit in FIG. 5 includes seven transistors (the first transistor T1 to the seventh transistor T7), a storage capacitor C, and seven signal lines (the signal line D, the first scan signal line S1, the second scan signal line S2, the emitting signal line E, the initial signal line INIT, the first power line VDD, and the second power line VSS), and the seven transistors are all P-type transistors.

In an exemplary implementation, the working process of the pixel driving circuit may include the following stages.

In a first stage A1, referred to as a reset stage, a signal of the second scan signal line S2 is a low-level signal, and signals of the first scan signal line S1 and the emitting signal line E are high-level signals. The signal of the second scan signal line S2 is a low-level signal, so that the first transistor T1 is turned on, and a signal of the initial signal line INIT is provided to the second node N2 to initialize the storage capacitor C to clear an original data voltage in the storage capacitor. The signals of the first scan signal line S1 and the emitting signal line E are high-level signals, so that the second transistor T2, the fourth transistor T4, the fifth transistor T5, the sixth transistor T6, and the seventh transistor T7 are turned off. The OLED does not emit light in this stage.

In a second stage A2, referred to as a data writing stage or threshold compensating stage, a signal of the first scan signal line S1 is a low-level signal, signals of the second scan signal line S2 and the light emitting signal line E are high-level signals, and the data line D outputs a data voltage. In this stage, the second terminal of the storage capacitor C is a low level, so that the third transistor T3 is turned on. The signal of the first scan signal line S1 is a low-level signal, so that the second transistor T2, the fourth transistor T4, and the seventh transistor T7 are turned on. The second transistor T2 and the fourth transistor T4 are turned on so that the data voltage output by the data line D is provided to the second node N2 through the first node N1, the turned-on third transistor T3, the third node N3, and the turned-on second transistor T2, and a voltage difference between the data voltage output by the data line D and a threshold voltage of the third transistor T3 is charged to the storage capacitor C, where a voltage at the second terminal (the second node N2) of the storage capacitor C is Vd−|Vth|, the data voltage output by the data line D is Vd, and the threshold voltage of the third transistor T3 is Vth. The seventh transistor T7 is turned on, so that the initial voltage of the initial signal line INIT is provided to a first electrode of the OLED to initialize (reset) the first electrode of the OLED and clear a pre-stored voltage therein to complete initialization to ensure that the OLED does not emit light. The signal of the second scan signal line S2 is a high-level signal, so that the first transistor T1 is turned off. The signal of the emitting signal line E is a high-level signal, so that the fifth transistor T5 and the sixth transistor T6 are turned off.

In a third stage A3, referred to as an emitting stage, the signal of the emitting signal line E is a low-level signal, and the signals of the first scan signal line S1 and the second scan signal line S2 are high-level signals. The signal of the emitting signal line E is a low-level signal, so that the fifth transistor T5 and the sixth transistor T6 are turned on, and a power voltage output by the first power line VDD provides a drive voltage to the first electrode of the OLED through the turned-on fifth transistor T5, the third transistor T3, and the sixth transistor T6 to drive the OLED to emit light.

In a driving process of the pixel driving circuit, a drive current flowing through the third transistor T3 (drive transistor) is determined by a voltage difference between the gate electrode and first electrode thereof. A voltage of the second node N2 is Vdata-|Vth|, so that the drive current of the third transistor T3 is:

$$I=K^*(Vgs-Vth)^2=K^*[(Vdd-Vd+|Vth|)-Vth]^2=K^*[(Vdd-Vd]^2,$$

where I is the drive current flowing through the third transistor T3, that is, the drive current for driving the OLED, K is a constant, Vgs is the voltage difference between the gate electrode and the first electrode of the third transistor T3, Vth is the threshold voltage of the third transistor T3, Vd is the data voltage output by the data line D, and Vdd is the supply voltage output by the first power line VDD.

Figure 7:
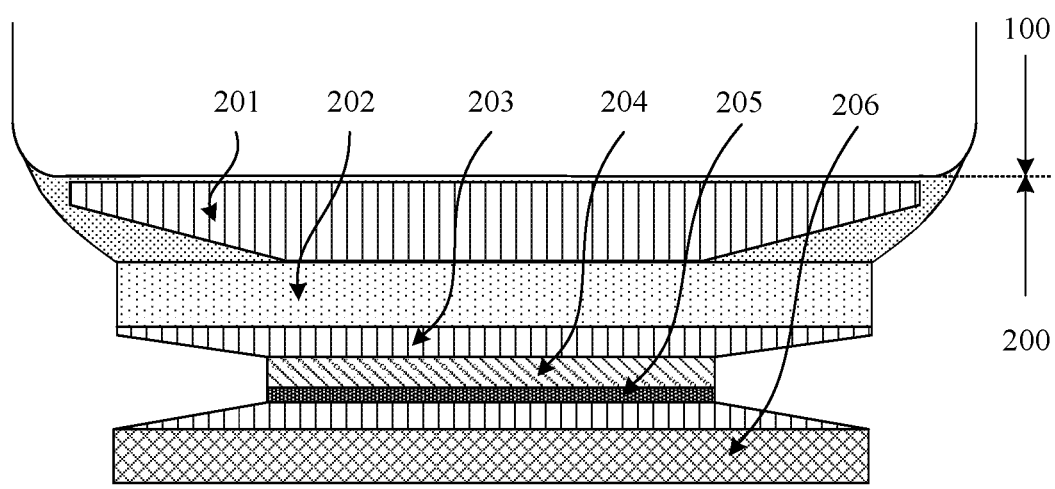
FIG. 7 is a schematic diagram of a planar structure of a bonding area in a display substrate.
Figure 8:
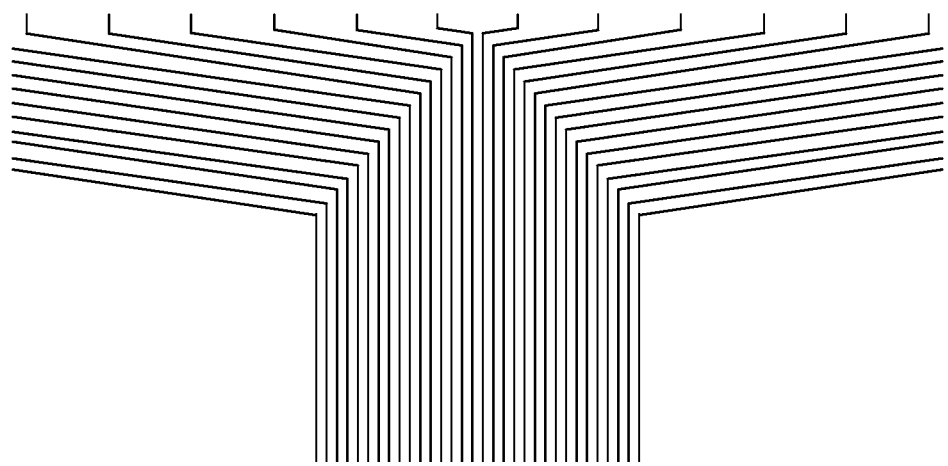
FIG. 8 is a schematic diagram of data fan-out lines in a bonding area.

FIG. 7 is a schematic diagram of a planar structure of a bonding area in a display substrate, and FIG. 8 is a schematic diagram of data fan-out lines in a bonding area. As shown in FIG. 7, in a plane parallel to the display substrate, a bonding area 200 is located on a side of a display area 100. The bonding area 200 may include a first fan-out region 201, a bending region 202, a second fan-out region 203, an anti-static region 204, a driver chip region 205, and a bonding pin region 206 that are arranged in sequence along a direction away from the display area 100. The first fan-out region 201 at least includes data fan-out lines. A plurality of data fan-out lines are configured to be connected to Data Lines of the display area in a Fanout wiring manner, as shown in FIG. 8. The bending region 202 includes a composite insulating layer provided with a groove, and is configured to bend the bonding area 200 to the back of the display area 100. The second fan-out region 203 includes a plurality of data fan-out lines that are led out in a fan-out wiring manner. The anti-static region 204 includes an anti-static circuit configured to prevent electrostatic damage of the display substrate by eliminating electrostatic. The driver chip region 205 includes an Integrated Circuit (IC) and is configured to be connected to the plurality of data fan-out lines. The bonding pin region 206 includes Bonding Pads, and is configured to be bonded to an external Flexible Printed Circuit (FPC).

With the development of OLED display technologies, consumers have higher requirements for the display effect of display products. Super-narrow bezels have become a new trend in the development of display products. Therefore, bezel narrowing or even a bezel-less design has received more attention in the design of OLED display products. At present, a left bezel, a right bezel, and an upper bezel of a display apparatus may be controlled within 1.0 mm. However, the narrowing design of the lower bezel (a bezel on a side of the bonding area) is more difficult to implement, which is always maintained at about 2.0 mm. This is because the data fan-out lines are usually arranged in the fan-out region of the bonding area, where the fan-out region has large space occupation. Generally, a width of the bonding area is less than a width of the display area, the signal lines of the integrated circuit and the bonding pads in the bonding area are required to be led into a wider display area through the fan-out area in a fan-out manner, the greater the width difference between the display area and the bonding area, the more the oblique fan-out lines in the fan-out region, the longer the distance between the driver chip region and the display area, and the wider the lower bezel, resulting in that the lower bezel is much larger than the left bezel and right bezel.

Figure 9:
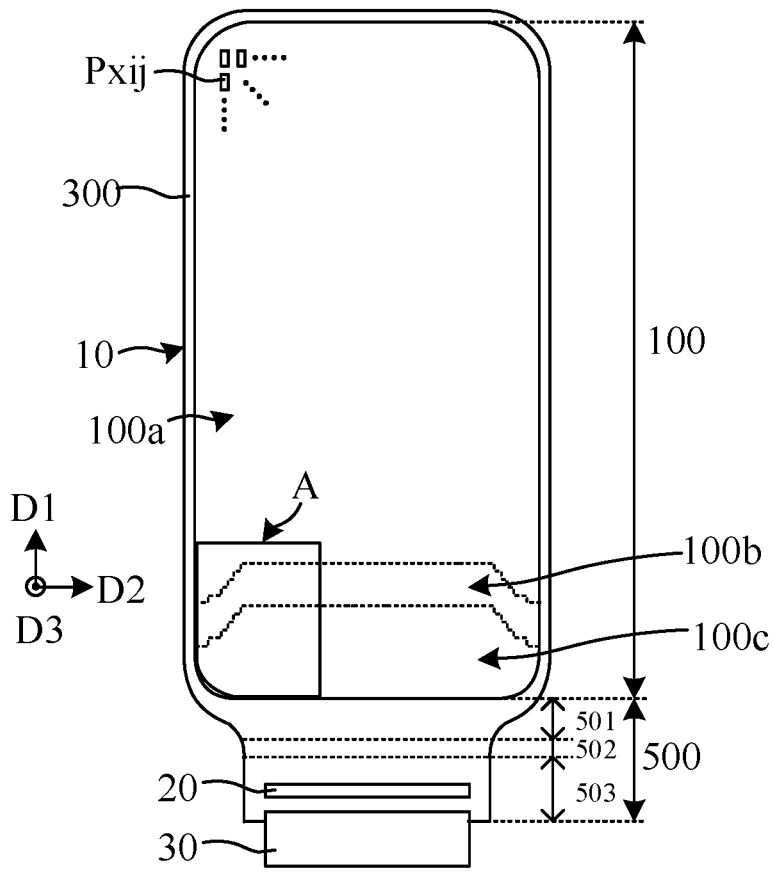
FIG. 9 is a schematic diagram of a planar structure of a display substrate according to an exemplary implementation of the present disclosure.
Figure 10:
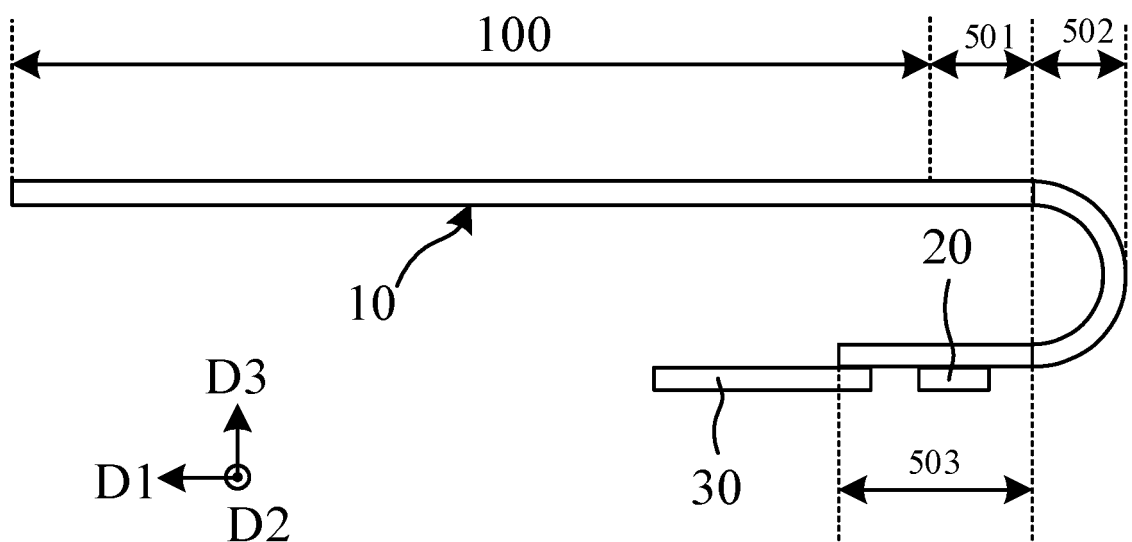
FIG. 10 is a side view of the display substrate in FIG. 9.

FIG. 9 is a schematic diagram of a planar structure of a display substrate according to an exemplary embodiment of the present disclosure, and FIG. 10 is a side view of the display substrate in FIG. 9. As shown in FIG. 9 and FIG. 10, the display substrate 10 may include a display area 100, a bonding area 500 on a side, opposite to a first direction D1, of the display area 100, and a bezel area 300 on other sides of the display area 100. In an exemplary implementation, the display area 100 may be a planarization area, including a plurality of sub-pixels Pxij forming a pixel array to display a dynamic picture or a static image. The display substrate may be a flexible substrate, and accordingly can be deformable, for example, can be crimped, bent, folded, or curled.

In an exemplary implementation, the bonding area 500 may include a lead region 501, a bending region 502, and a composite circuit region 503 that are arranged in sequence along an opposite direction (a direction away from the display area) of the first direction D1. The lead region 501 is connected to the display area 100, the bending region 502 is connected to the lead region 501, and the composite circuit region 503 is connected to the bending region 502.

In an exemplary implementation, the lead region 501 may be provided with a plurality of lead lines. One end of the plurality of lead lines is correspondingly connected to the plurality of data lines in the display area 100, and the other end is connected to an integrated circuit of the composite circuit region 503, so that the integrated circuit applies data signals to the data lines through the lead lines.

In an exemplary implementation, the bending region 502 may be bent with a curvature in a third direction D3, so that a surface of the composite circuit region 503 may be turned over, that is, a surface, facing upwards, of the composite circuit region 503 may be changed to face downwards through the bending of the bending region 502, where the third direction D3 intersects with the first direction D1. In an exemplary implementation, when the bending region 502 is bent, the composite circuit region 503 may be overlapped with the display area 100 in the third direction D3 (a thickness direction).

In an exemplary implementation, the composite circuit region 503 may include an anti-static region, a driver chip region, and a bonding pin region. An Integrated Circuit (IC) 20 may be bonded to the driver chip region, and a Flexible Printed Circuit (FPC) 30 may be bonded to the bonding pin region. In an exemplary implementation, the integrated circuit 20 may generate a drive signal required for driving sub-pixels, and may provide the drive signal to the sub-pixels in the display area 100. For example, the drive signal may be a data signal that drives the luminance of the sub-pixels. In an exemplary implementation, the integrated circuit 20 may be bonded to the driver chip region by an anisotropic conductive film or other ways. A width of the integrated circuit 20 in a second direction D2 may be less than a width of the composite circuit region 503 in the second direction D2, where the second direction D2 is intersected with the first direction D1. In an exemplary implementation, the bonding pin region may be provided with bonding pads containing a plurality of PINs, and the flexible circuit board 30 may be bonded to the bonding pads.

In an exemplary implementation, the first direction D1 may be an extension direction (a column direction) of the data lines in the display area, the second direction D2 may be an extension direction (a row direction) of the scan signal lines in the display area, the third direction D3 may be a direction perpendicular to the plane of the display substrate, the first direction D1 and the second direction D2 may be perpendicular to each other, and the first direction D1 and the third direction D3 may be perpendicular to each other.

Figure 11:
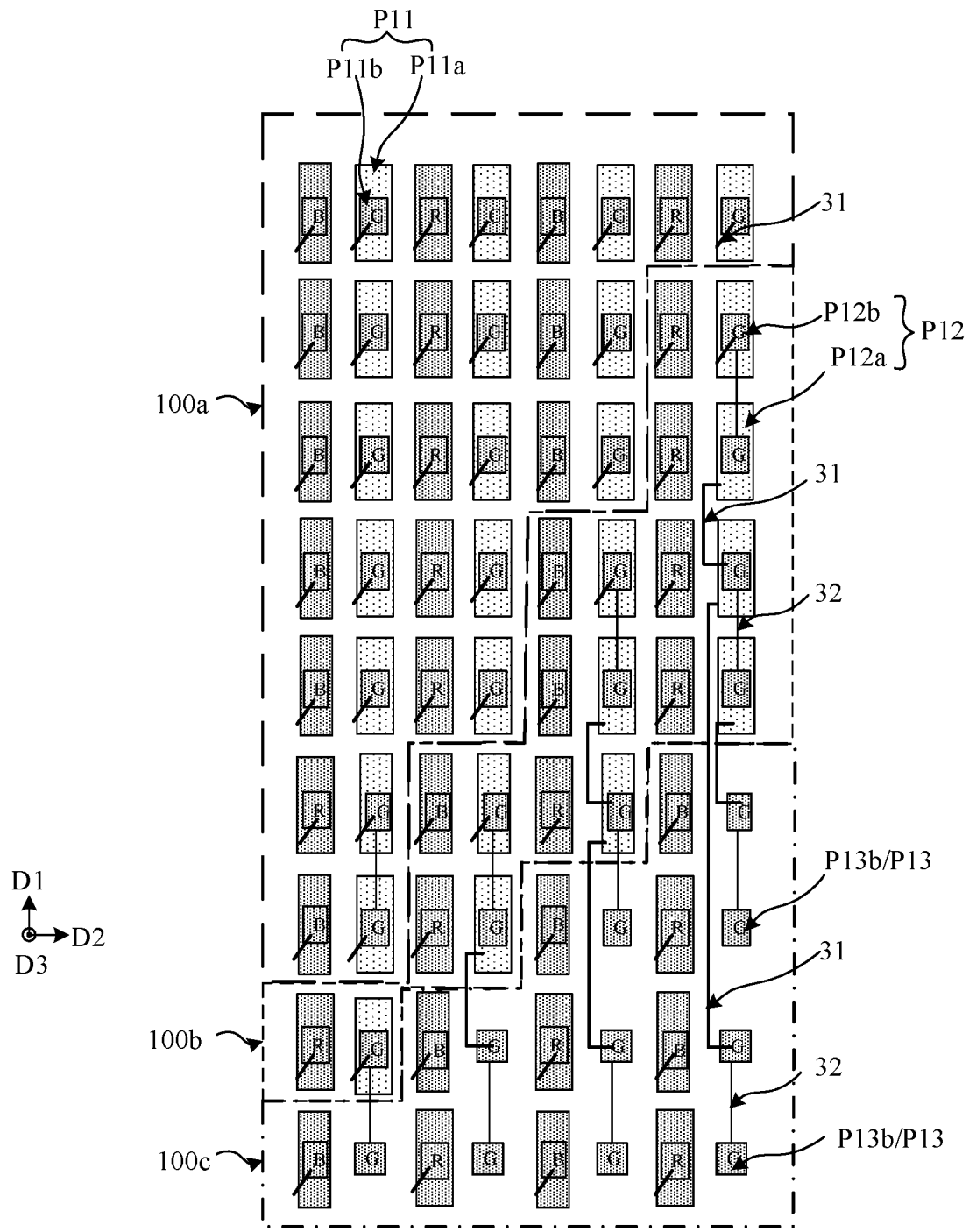
FIG. 11 is a schematic diagram of an enlarged structure of an area A in FIG. 9.
Figure 12:
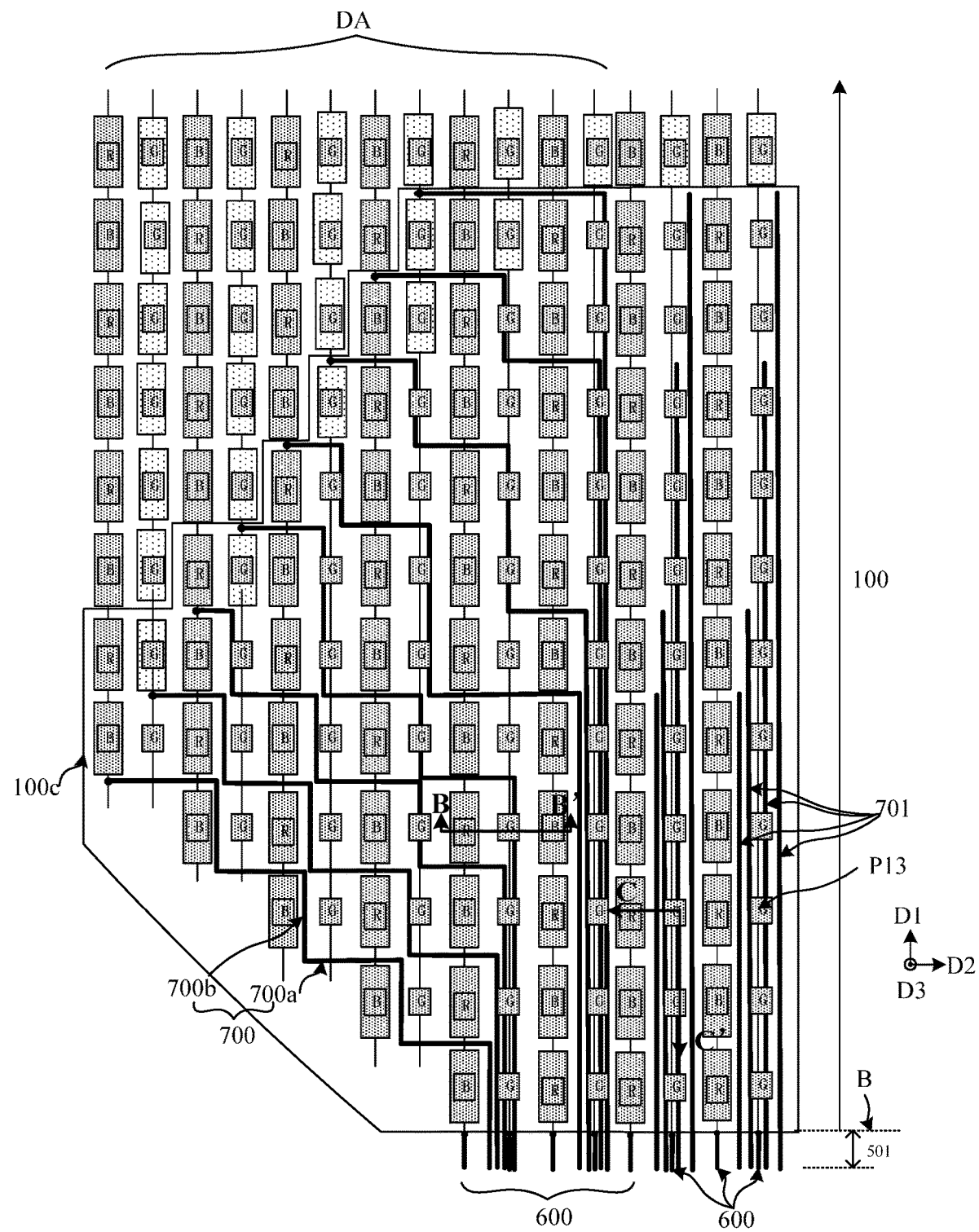
FIG. 12 is a schematic diagram of a layout structure of fan-out wiring in a fan-out wiring region in FIG. 9.

In an exemplary implementation, as shown in FIG. 9, the display area 100 includes a substrate and a first display region 100a, a second display region 100b, and a fan-out wiring region 100c arranged on the substrate, the second display region 100b being located between the first display region 100a and the fan-out wiring region 100c. FIG. 11 is a schematic diagram of an enlarged structure of an area A in FIG. 9, and FIG. 12 is a schematic diagram of a layout structure of fan-out wiring in the fan-out wiring region in FIG. 9. As shown in FIGS. 11 and 12, the display area 100 may include a plurality of sub-pixels, a plurality of data lines DA, and a plurality of data fan-out lines 700, an orthographic projection of the plurality of data lines DA on the display substrate plane is at least partially overlapped with an orthographic projection of the plurality of data fan-out lines 700 on the display substrate plane; and the lead region 501 of the bonding area may include a plurality of lead lines 600. In an exemplary implementation, the plurality of sub-pixels in the display area 100 are arranged in a matrix to form a plurality of pixel rows and a plurality of pixel columns. The plurality of data lines DA in the display area 100 extend along the first direction D1 or an opposite direction of the first direction D1, and are sequentially arranged at a set interval along the second direction D2, and each data line DA is connected to all sub-pixels of a pixel column in the display area 100. The plurality of lead lines 600 of the lead region 501 are sequentially arranged at a set interval along the second direction D2, first ends of the plurality of lead lines 600 are located at an edge B of the display area, and second ends of the plurality of lead lines 600 extend to the bending region in a direction away from the display area. First ends of the plurality of data fan-out lines 700 in the display area 100 are located at the edge B of the display area, and are correspondingly connected to the first ends of a part of the lead lines 600 in the lead region 501. Second ends of the plurality of data fan-out lines 700 extend in a direction away from the lead region, and are correspondingly connected to a part of data lines DA in the display area 100. A part of the lead lines 600 in the lead region 501 are connected to the data fan-out lines 700, and the other part of the lead lines 600 are correspondingly connected to the other part of the data lines DA that extend to the lead region 501. In an exemplary implementation, the edge B of the display area may be an edge on a side, close to the lead region 501, of the display area 100.

In an exemplary implementation, the first display region 100a may include a plurality of first sub-pixels P11, the first sub-pixel P11 may include a first pixel circuit P11a and a first light emitting element P11b, an orthographic projection of the first pixel circuit P11a on the display substrate is at least partially overlapped with an orthographic projection of the first light emitting element P11b on the display substrate; the second display region 100b may include a plurality of second sub-pixels P12, the second sub-pixel P12 may include a second pixel circuit P12a and a second light emitting element P12b, an orthographic projection of the second pixel circuit P12a on the display substrate is at least partially overlapped with an orthographic projection of the second light emitting element P12b on the display substrate, the first pixel circuit P11a and the second pixel circuit P12a being electrically connected to a plurality of data lines DA; the fan-out wiring region 100c may include a plurality of data fan-out lines 700 and a plurality of third sub-pixels P13 including a third light emitting element P13b; at least one second pixel circuit P12a is electrically connected to at least two light emitting elements selected from at least one of the second light emitting element P12b and the third light emitting element P13b, and the plurality of data fan-out lines 700 are electrically connected to the plurality of data lines DA.

In an exemplary implementation, at least one second pixel circuit P12a being electrically connected with at least two light emitting elements includes any one or more of the following:

at least one second pixel circuit P12a being electrically connected with at least two second light emitting elements P12b;

at least one second pixel circuit P12a being electrically connected with at least two third light emitting elements P13b; and at least one second pixel circuit P12a being electrically connected with at least one second light emitting element P12b and at least one third light emitting element P13b.

In an exemplary implementation, the data lines DA and the data fan-out lines 700 may be arranged in different film layers, and an insulating layer may be arranged between the data lines DA and the data fan-out lines 700.

In an exemplary implementation, the lead lines 600 and the data fan-out lines 700 may be arranged in the same film layer and formed simultaneously in a single patterning process, and the lead lines 600 and the data fan-out lines 700 may be connected to each other to form an integrated structure.

In an exemplary implementation, the lead lines 600 and the data fan-out lines 700 may be arranged in different film layers, an insulating layer may be arranged between the lead lines 600 and the data fan-out lines 700, and the lead lines 600 are connected with the data fan-out lines 700 through via holes.

In an exemplary implementation, the plurality of lead lines 600 may be arranged to be parallel to the first direction D1, that is, the lead lines 600 are parallel to the data lines DA.

In an exemplary implementation, there is no overlapping area between an orthographic projection of any one of the lead lines 600 on the substrate and orthographic projections of the other lead lines 600 on the substrate, and there is no overlapping area between an orthographic projection of any one of the data fan-out lines 700 on the substrate and orthographic projections of the other data fan-out lines 700 on the substrate.

In an exemplary implementation, an orthographic projection of the second pixel circuit P12a on the display substrate plane is not overlapped with an orthographic projection of the third light emitting element P13b on the display substrate plane. That is, the third sub-pixel P13 does not have a pixel circuit, but only a light emitting element, and the third sub-pixel P13 is driven by the second pixel circuit P12a.

In an exemplary implementation, the data fan-out lines 700 are stepped wiring, and an orthographic projection of the data fan-out line 700 on the display substrate plane is not overlapped with orthographic projections of the first pixel circuit P11a and the second pixel circuit P12a on the display substrate plane.

In an exemplary implementation, the display area 100 includes a first connecting line 31 and a second connecting line 32. The first connecting line 31 is configured to connect at least one of: an anode of the first light emitting element P11b and the first pixel circuit P11a, an anode of the second light emitting element P12b and the second pixel circuit P12a, an anode of the third light emitting element P13b and the second pixel circuit P12a. The second connecting line 32 is configured to connect anodes of at least two light emitting elements selected from at least one of the second light emitting element P12b and the third light emitting element P13b.

In an exemplary implementation, the materials of the first connecting line 31 and the second connecting line 32 are transparent conductive materials.

In an exemplary implementation, as shown in FIG. 12, the data fan-out line 700 includes at least one transverse connecting portion 700a extending in a second direction D2 and at least one longitudinal connecting portion 700b extending in a first direction D1, the second direction D2 crosses the first direction D1, the first direction D1 is parallel to the data line DA, an orthographic projection of the transverse connecting portion 700a on the display substrate plane is not overlapped with an orthographic projection of the third light emitting element P13b on the display substrate plane, and there is at least an overlapping area between an orthographic projection of the longitudinal connecting portion 700b on the display substrate plane and the orthographic projection of the third light emitting element P13b on the display substrate plane.

In an exemplary implementation, the fan-out wiring region includes a first color light emitting element, a second color light emitting element and a third color light emitting element, and the second connecting line 32 is configured to connect anodes of at least two third color light emitting elements.

In an exemplary implementation, the third color light emitting element may be a green light emitting element or a light emitting element of another color.

In an exemplary implementation, the third sub-pixel further includes a third pixel circuit, an orthographic projection of the third pixel circuit on the display substrate is at least partially overlapped with an orthographic projection of the first color light emitting element or the second color light emitting element on the display substrate, and is not overlapped with an orthographic projection of the third color light emitting element on the display substrate.

In an exemplary implementation, the second connecting line 32 is further configured to connect at least one of: anodes of at least two first color light emitting elements and anodes of at least two second color light emitting elements.

In an exemplary implementation, the first color light emitting element may be a red light emitting element and the second color light emitting element may be a blue light emitting element; or, the first color light emitting element may be a blue light emitting element and the second color light emitting element may be a red light emitting element.

Figure 13:
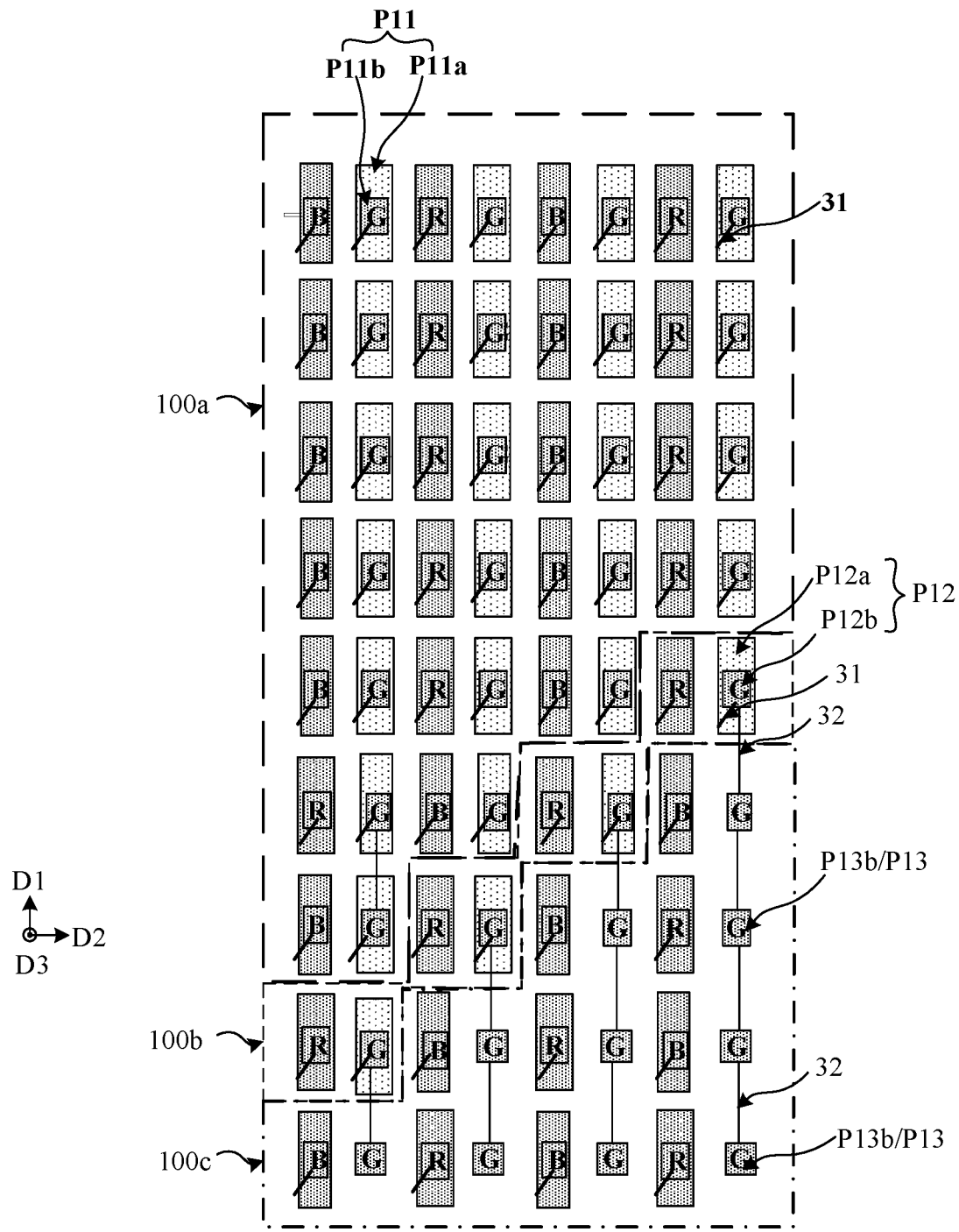
FIG. 13 is another schematic diagram of an enlarged structure of the area A in FIG. 9.

FIG. 13 is another schematic diagram of an enlarged structure of the area A in FIG. 9. In an exemplary implementation, as shown in FIG. 13, at least one second pixel circuit P12a being electrically connected with at least two light emitting elements includes any one or more of the following:

two light emitting elements being connected in series and then connected with one second pixel circuit P12a, the two light emitting elements being selected from at least one of the second light emitting element and the third light emitting element;

three light emitting elements being connected in series and then connected with one second pixel circuit P12a, the three light emitting elements being selected from at least one of the second light emitting element and the third light emitting element;

four light emitting elements being connected in series and then connected with one second pixel circuit P12a, the four light emitting elements being selected from at least one of the second light emitting element and the third light emitting element; and five light emitting elements being connected in series and then connected with one second pixel circuit P12a, the five light emitting elements being selected from at least one of the second light emitting element and the third light emitting element.

In an exemplary implementation, the quantity of data fan-out lines 700 is smaller than or equal to the quantity of data lines DA.

In an exemplary implementation, as shown in FIG. 12, at least one third sub-pixel P13 includes a dummy data fan-out line 701 which is connected to a fixed potential signal line through a signal line.

In an exemplary implementation, in a plane perpendicular to the display substrate, the display substrate includes a semiconductor layer, a first gate electrode layer, a second gate electrode layer, a source-drain electrode layer and an anode stacked on a substrate, and an insulating layer is arranged between the first gate electrode layer and the second gate electrode layer, between the second gate electrode layer and the source-drain electrode layer, and between the source-drain electrode layer and the anode, wherein:
 the semiconductor layer includes active layers of a plurality of transistors, the first gate electrode layer includes a plurality of scan signal lines, gate electrodes of the plurality of transistors and a plurality of first capacitor electrodes, the second gate electrode layer includes a plurality of second capacitor electrodes, and the source-drain electrode layer includes a plurality of data lines DA, and source electrodes and drain electrodes of the plurality of transistors; the first capacitor electrode and the second capacitor electrode form a capacitor, and the transistor and the capacitor form a pixel circuit;
 the plurality of data fan-out lines 700 may be arranged in the same layer as one or more of the first gate electrode layer and the second gate electrode layer.

Figure 14:
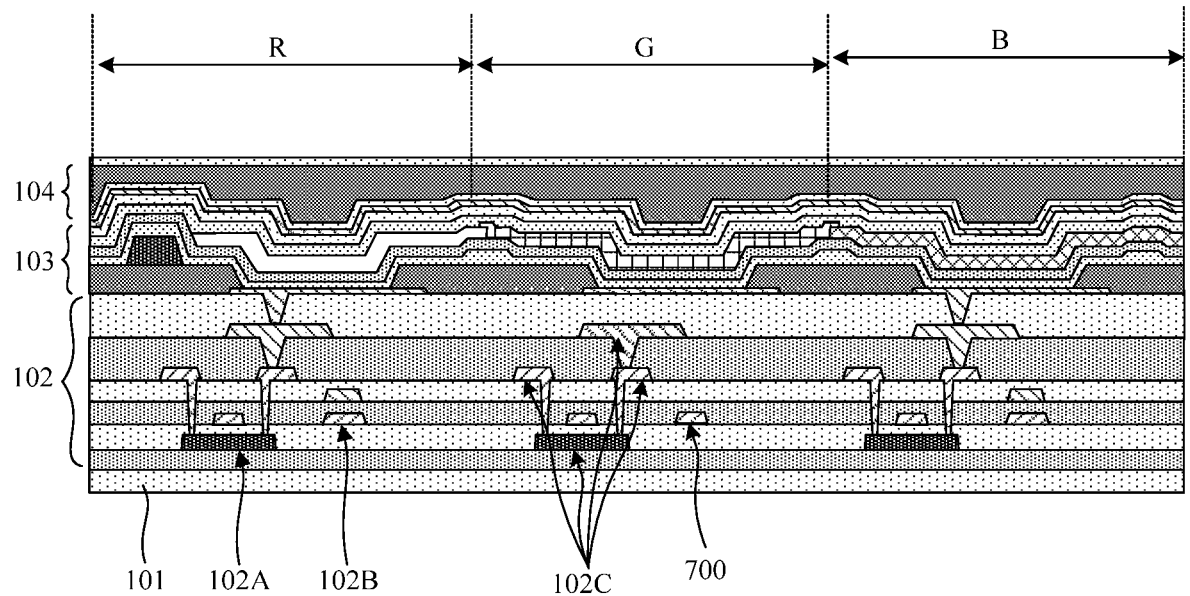
FIG. 14 is a schematic diagram of a sectional structure in a B-B' direction in FIG. 12.

In an exemplary implementation, as shown in FIG. 14, the display substrate includes a semiconductor layer, a first gate electrode layer, a second gate electrode layer, a first source-drain electrode layer, a second source-drain electrode layer, and an anode stacked on a substrate, wherein:
 the semiconductor layer includes active layers of a plurality of transistors, the first gate electrode layer includes gate electrodes of the plurality of transistors and a plurality of first capacitor electrodes, the second gate electrode layer includes a plurality of second capacitor electrodes, the first source-drain electrode layer includes a plurality of data lines, and the source electrodes and drain electrodes of the plurality of transistors, and the second source-drain electrode layer includes connecting electrodes; the first capacitor electrode and the second capacitor electrode form a capacitor, and the transistor and the capacitor form a pixel circuit;
 the plurality of data fan-out lines 700 may be arranged in the same layer as one or more of the first gate electrode layer, the second gate electrode layer and the second source-drain electrode layer.

Figure 15:
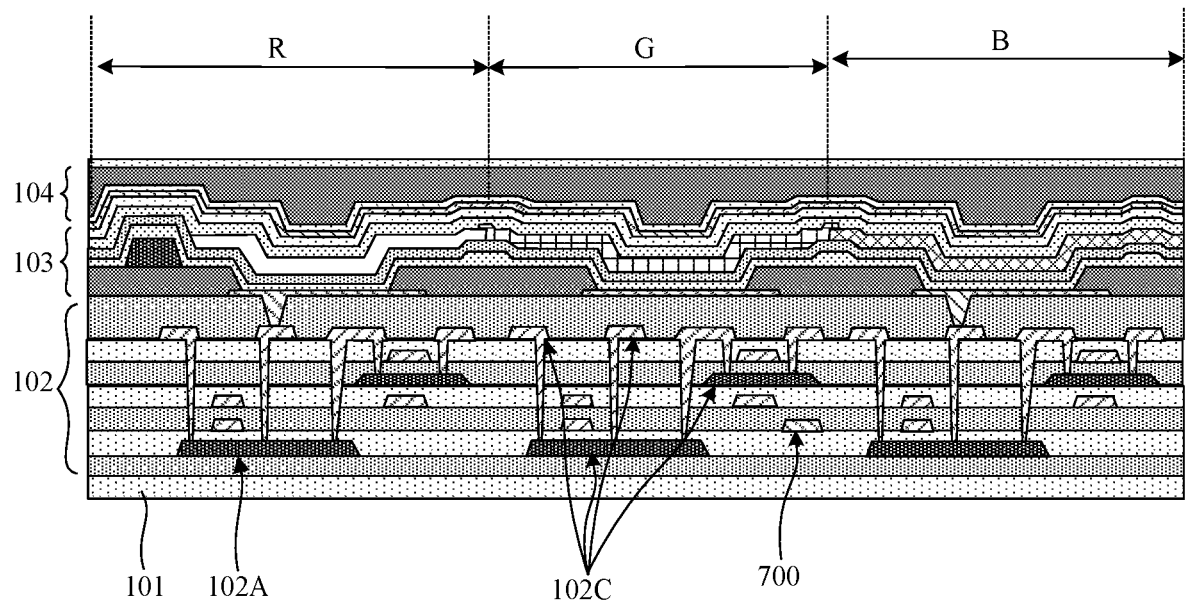
FIG. 15 is another schematic diagram of a sectional structure in the B-B' direction in FIG. 12.

In an exemplary implementation, as shown in FIG. 15, the display substrate includes a light shielding layer (not shown in the figure), a first semiconductor layer, a first gate electrode layer, a second gate electrode layer, a second semiconductor layer, a third gate electrode layer, a source-drain electrode layer, and an anode stacked on a substrate, wherein:
 the first semiconductor layer includes an active layer of at least one polysilicon transistor, the first gate electrode layer includes a gate electrode of at least one polysilicon transistor and a plurality of first capacitor electrodes, the second gate electrode layer includes a plurality of second capacitor electrodes, the second semiconductor layer includes an active layer of at least one oxide transistor, the third gate electrode layer includes a gate electrode of at least one oxide transistor, and the source-drain electrode layer includes a plurality of data lines, and source electrodes and drain electrodes of a plurality of transistors;
 the plurality of data fan-out lines 700 may be arranged in the same layer as one or more of the light shielding layer, the first gate electrode layer, the second gate electrode layer, and the third gate electrode layer.

In an exemplary implementation, as shown in FIG. 14 or FIG. 15, at least one third sub-pixel P13 includes any one or more of the following dummy electrode lines 102C: a dummy active layer, a dummy gate electrode, a dummy capacitor electrode, and a dummy source-drain electrode. The dummy electrode line 102C is connected to a fixed potential signal line through a signal line.

Exemplary description is made below through a preparation process of the display substrate. "Patterning process" mentioned in the present disclosure includes photoresist coating, mask exposure, development, etching, photoresist stripping, etc., for metal materials, inorganic materials or transparent conductive materials, and includes organic material coating, mask exposure, development, etc., for organic materials. Any one or more of sputtering, evaporation and chemical vapor deposition may be used for deposition, any one or more of spray coating, spin coating and inkjet printing may be used for coating, and any one or more of dry etching and wet etching may be used for etching, which are not limited in the present disclosure. A "thin film" refers to a layer of thin film manufactured with a certain material on a substrate using deposition, coating or other processes. If the "thin film" does not need the patterning process in the entire manufacturing process, the "thin film" may also be called a "layer". If the "thin film" needs the patterning process in the entire manufacturing process, the "thin film" is called a "thin film" before the patterning process and is called a "layer" after the patterning process. The "layer" which has experienced the patterning process includes at least one "pattern". "A and B being arranged in the same layer" in the present disclosure means that A and B are formed simultaneously through a single patterning process, and the "thickness" of a film layer is the dimension of the film layer in a direction perpendicular to the display substrate. In an exemplary embodiment of the present disclosure, "an orthographic projection of A includes an orthographic projection of B" or "an orthographic projection of B is within a range of an orthographic projection of A" means that an edge of a display area of the orthographic projection of B falls within an edge range of a display area of the orthographic projection of A, or an edge of a display area of the orthographic projection of A and an edge of a display area of the orthographic projection of B are overlapped with each other.

In an exemplary implementation, the preparation process of the display substrate may include the following operations.

(1) A pattern of a semiconductor layer is formed on a substrate. In an exemplary implementation, forming a pattern of a semiconductor layer on a substrate may include: sequentially depositing a first insulating thin film and a semiconductor thin film on the substrate, and patterning the semiconductor thin film through a patterning process to form a first insulating layer overlying the whole substrate and a pattern of a semiconductor layer arranged on the first insulating layer, the pattern of the semiconductor layer at least including active layers of a plurality of transistors. The pattern of the semiconductor layer is formed in the first display region and the second display region. In an exemplary implementation, the pattern of the semiconductor layer may alternatively be formed in the fan-out wiring region. Because the data fan-out line formed subsequently includes at least one section of transverse connecting portion and at least one section of vertical connecting portion, and the transverse connecting portion of the data fan-out line may be arranged between two adjacent sub-pixels, thus the transverse connecting portion of the data fan-out line does not affect the layout of the pixel circuit in a sub-pixel adjacent to the transverse connecting portion, or in other words, the transverse connecting portion of the data fan-out line has little influence on the layout of the pixel circuit in a sub-pixel adjacent to the transverse connecting portion. Therefore, in the fan-out wiring region, no pixel circuit is arranged in a sub-pixel whose orthographic projection on the substrate is overlapped with an orthographic projection of the vertical connecting portion of the data fan-out line on the substrate, while a pixel circuit may be arranged in a sub-pixel adjacent to the transverse connecting portion of the data fan-out line. That is, each sub-pixel in the first display region and the second display region includes the pattern of the semiconductor layer, and some or all of the sub-pixels in the fan-out wiring region do not include the pattern of the semiconductor layer. In an exemplary implementation, the substrate may be a flexible substrate.

(2) A pattern of a first conductive layer is formed. In an exemplary implementation, forming a pattern of a first conductive layer may include: sequentially depositing a second insulating thin film and a first metal thin film on the substrate on which the above-mentioned pattern is formed, and patterning the first metal thin film through a patterning process to form a second insulating layer overlying the pattern of the semiconductor layer and a pattern of a first conductive layer arranged on the second insulating layer. The pattern of the first conductive layer at least includes a plurality of data fan-out lines, a plurality of scan signal lines, gate electrodes of a plurality of transistors, and a plurality of first capacitor electrodes that are located in the display area, and a plurality of lead lines that are located in the lead region of the bonding area. The data fan-out lines and the lead lines may be connected to each other to form an integrated structure. In an exemplary implementation, the data fan-out lines are formed in the fan-out wiring region, and in an exemplary implementation, the first conductive layer may be referred to as a first gate electrode (GATE 1) layer.

(3) A pattern of a second conductive layer is formed. In an exemplary implementation, forming a pattern of a second conductive layer may include: depositing sequentially a third insulating thin film and a second metal thin film on the substrate on which the above-mentioned patterns are formed, and patterning the second metal thin film through a patterning process to form a third insulating layer overlying the pattern of the first conductive layer and a pattern of a second conductive layer arranged on the third insulating layer. The pattern of the second conductive layer at least includes a plurality of second capacitor electrodes that are located in the display area. In an exemplary embodiment, the second conductive layer may be called a second gate electrode (GATE 2) layer.

(4) A pattern of a fourth insulating layer is formed. In an exemplary implementation, forming a pattern of a fourth insulating layer may include: depositing a fourth insulating thin film on the substrate on which the above-mentioned patterns are formed, and patterning the fourth insulating thin film through a patterning process to form a fourth insulating layer overlying the pattern of the second conductive layer. The fourth insulating layer is provided with a plurality of via holes which may include: active via holes at positions of a plurality of active layers in the display area, and a plurality of first via holes and second via holes that are located at end portions of the data fan-out lines in the display area. The active via holes expose the active layers, the first via holes expose the data fan-out lines, and the second via holes expose the lead lines.

(5) A pattern of a third conductive layer is formed. In an exemplary implementation, forming a pattern of a third conductive layer may include: depositing a third metal thin film on the substrate on which the above-mentioned patterns are formed, and patterning the third metal thin film through a patterning process to form a pattern of a third conductive layer on the fourth insulating layer. The pattern of the third conductive layer at least includes: a plurality of data lines, and sources electrodes and drain electrodes of a plurality of transistors, the source electrodes and the drain electrodes are respectively connected to the corresponding active layers through active via holes, the plurality of data lines extend to the lead region of the bonding area, a part of the data lines are connected to the data fan-out lines through the first via hole, and the other part of data lines are connected to the lead lines through the second via hole. In an exemplary embodiment, the third conductive layer may be called a first source-drain electrode (SD1) layer.

(6) A pattern of an electrode connecting layer is formed. In an exemplary implementation, forming a pattern of an electrode connecting layer may include: sequentially depositing a fifth insulating thin film and an electrode connecting layer thin film on the substrate on which the above-mentioned patterns are formed, and patterning the fifth insulating thin film and the electrode connecting layer thin film respectively through a patterning process to form a fifth insulating layer overlying the pattern of the third conductive layer and a pattern of an electrode connecting layer provided on the fifth insulating layer. The fifth insulating layer is provided with a plurality of third via holes, and the fifth insulating layer in the third via holes is removed to expose a surface of drain electrodes of the plurality of transistors. The pattern of the electrode connecting layer at least includes a plurality of first connecting lines and second connecting lines insulated from each other, one end of the first connecting line is connected with the drain electrode of the transistor through the third via hole, the first connecting lines are formed in the first display region, the second display region and the fan-out wiring region, the second connecting lines are formed in the second display region and the fan-out wiring region, the first connecting line is configured to connect anodes of first light emitting elements, anodes of a part of second light emitting elements and anodes of a part of third light emitting elements, which are all formed subsequently, to the drain electrodes of the transistors, and the second connecting line is configured to connect anodes of the second light emitting elements and anodes of the third light emitting elements formed subsequently to each other in pairs.

(7) A pattern of a planarization layer is formed. In an exemplary implementation, forming a pattern of a planarization layer may include: coating a planarization thin film on the substrate on which the above-mentioned patterns are formed, and patterning the planarization thin film through a patterning process to form a planarization layer overlying the electrode connecting layer. The planarization layer is provided with a fourth via hole and a fifth via hole, the fourth via hole exposes the other end of the first connecting line, the fifth via hole exposes both ends of the second connecting line, the fourth via hole is arranged so that the anodes of the first light emitting elements, the anodes of a part of the second light emitting elements and the anodes of a part of the third light emitting elements formed subsequently are connected to the other end of the first connecting line through the via hole, and the fifth via hole is arranged so that the anodes of the second light emitting elements and the anodes of the third light emitting elements formed subsequently are connected to the second connecting line through the via hole.

(8) A pattern of an anode is formed. In an exemplary implementation, forming a pattern of an anode may include: depositing a transparent conductive thin film on the substrate on which the above-mentioned patterns are formed, and patterning the transparent conductive thin film through a patterning process to form an anode disposed on the planarization layer. The anodes of the first light emitting elements, the anodes of a part of the second light emitting elements and the anodes of a part of the third light emitting elements are connected to the other end of the first connecting line through the fourth via hole, and the anodes of the second light emitting elements and the anodes of the third light emitting elements are connected to the second connecting line through the fifth via hole.

Figure 16:
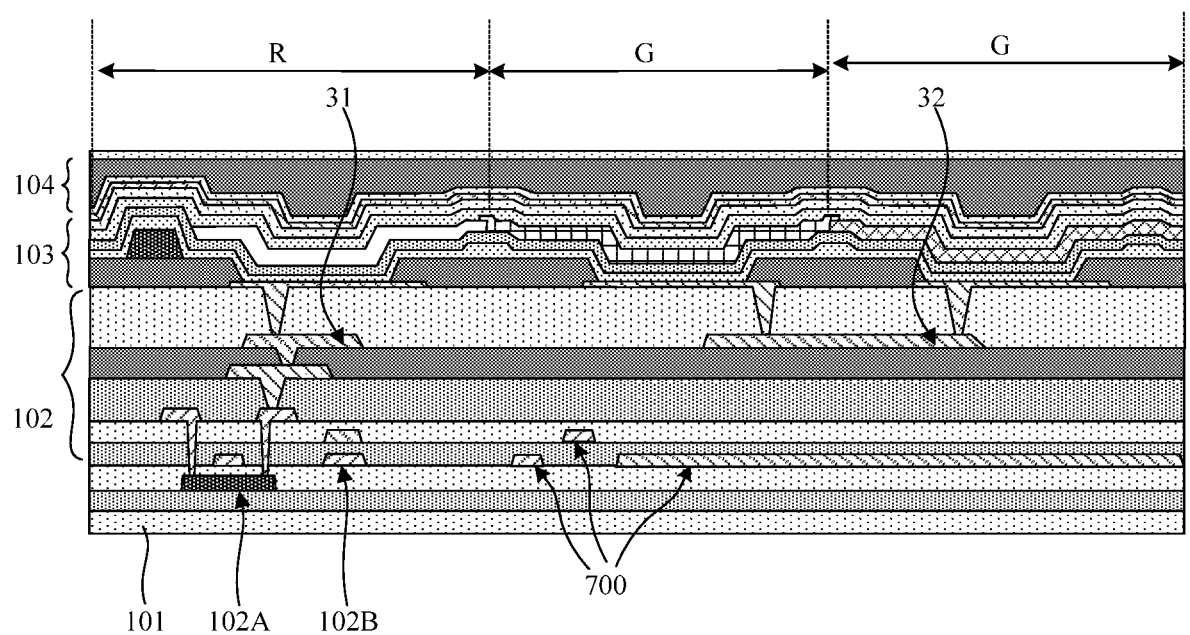
FIG. 16 is a schematic diagram of a sectional structure in a C-C' direction in FIG. 12.

In an exemplary implementation, a subsequent preparation process may include: coating a pixel definition thin film, and patterning the pixel definition thin film through a patterning process to form a pixel define layer, the pixel define layer of each sub-pixel being provided with a pixel opening which exposes the anode; forming an organic light emitting layer using an evaporation or ink-jet printing process, and forming a cathode on the organic light emitting layer; and forming an encapsulation layer which may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is arranged between the first encapsulation layer and the third encapsulation layer so that it can be ensured that external water vapor cannot enter the light emitting structure layer, as shown in FIG. 16.

In an exemplary implementation, the substrate may be a flexible substrate or a rigid substrate. The rigid substrate may be made of, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a surface-treated polymer soft film, or the like; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the first conductive layer, the second conductive layer, and the third conductive layer may be made of a metal material, for example, any one or more of Argentum (Ag), Copper (Cu), Aluminum (Al), and Molybdenum (Mo), or an alloy material of the above-mentioned metals, for example, an Aluminum-Neodymium alloy (AlNd) or a Molybdenum-Niobium alloy (MoNb), and may be in a single-layer structure, or in a multilayer composite structure such as Mo/Cu/Mo, etc. The material of the electrode connecting layer is a transparent conductive material, which may specifically be indium tin oxide (ITO) or indium zinc oxide (IZO). The first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be a single layer, multiple layers, or a composite layer. The first insulating layer is called a buffer layer, which is used to improve the water and oxygen resistance of the substrate. The second insulating layer and the third insulating layer are called gate insulating (GI) layers. The fourth insulating layer is called an interlayer insulating (ILD) layer. The planarization layer may be made of an organic material, and the transparent conductive thin film may be made of indium tin oxide (ITO) or indium zinc oxide (IZO). The active layer may be made of polysilicon (p-Si), that is, the present disclosure is applicable to LTPS thin film transistors.

Although the preparation process of the display substrate in this embodiment has been described by taking the case as an example where the data fan-out lines are arranged on the first conductive layer and the data lines are arranged on the third conductive layer, in the present disclosure, the data fan-out lines and the data lines may be arranged in any layer, as long as it is ensured that the data lines and the data fan-out lines are located in different conductive layers, and this is not limited in the present disclosure.

The structure of the display substrate and its preparation process in the present disclosure are only exemplary description. In an exemplary implementation, variation of corresponding structures and addition or reduction of the patterning process may be performed as practically required, which is not limited in the present disclosure.

In a display substrate, the bonding area is provided with a fan-out region, and the data lines of the display area are led out through the data fan-out lines in the fan-out region. Because there are many oblique lines in a fan-out region, the lower bezel is relative wide, which is not conducive to the realization of a narrow bezel. In an exemplary embodiment of the present disclosure, the lead lines are arranged in the lead region of the bonding area, the data fan-out lines are arranged in the display area, and the lead lines are connected to the corresponding data signal lines through the data fan-out lines, so that not only corresponding connection between the plurality of lead lines and the plurality of data signal lines is implemented, but also the arrangement of oblique lines formed in a fan shape are not required in the lead region. The plurality of lead lines are vertical lines parallel to each other, which can be directly led into the composite circuit region of the bonding area, effectively reducing the length of the lead region in a vertical direction, greatly reducing the width of the lower bezel, and allowing the widths of the upper bezel, the lower bezel, the left bezel and the right bezel of the display apparatus to be similar and all below 1.0 mm, thus increasing a screen-to-body ratio, and facilitating the implementation of a bezel-less display.

In an exemplary embodiment of the present disclosure, by arranging a second pixel circuit in the sub-pixel in the second display region and arranging no pixel circuits, but only a third light emitting element, in the sub-pixel in the fan-out wiring region, the second pixel circuit may drive the second light emitting element, and may drive the third light emitting element, so that sufficient space can be vacated in the fan-out wiring region for the wiring of the data fan-out lines.

In an exemplary implementation, as shown in FIG. 14 or 15, in the fan-out wiring region, at least one third sub-pixel may be provided with any one or more of the following dummy electrode lines 102C: a dummy active layer, a dummy gate electrode, a dummy capacitor electrode, and a dummy source-drain electrode, and the dummy electrode line, herein the dummy electrode lines may be connected to a fixed potential signal line through a signal trace. In an exemplary embodiment of the present disclosure, by arranging a dummy electrode line in at least one third sub-pixel, the uniformity of the preparation process of the display substrate can be improved, thereby the preparation quality is improved.

An exemplary embodiment of the present disclosure further provides a method for preparing a display substrate, the display substrate including a display area and a non-display area surrounding the display area, the display area including a first display region, a second display region and a fan-out wiring region, the second display region being located between the first display region and the fan-out wiring region; the method including:

forming a plurality of first sub-pixels in the first display region, the first sub-pixel including a first pixel circuit and a first light emitting element, an orthographic projection of the first pixel circuit on the display substrate is at least partially overlapped with an orthographic projection of the first light emitting element on the display substrate; forming a plurality of second sub-pixels in the second display region, the second sub-pixel including a second pixel circuit and a second light emitting element, an orthographic projection of the second pixel circuit on the display substrate is at least partially overlapped with an orthographic projection of the second light emitting element on the display substrate, the first pixel circuit and the second pixel circuit being electrically connected with the plurality of data lines; forming a plurality of third sub-pixels and a plurality of data fan-out lines in the fan-out wiring region, the third sub-pixel including a third light emitting element, at least one second pixel circuit being electrically connected with at least two light emitting elements, the at least two light emitting elements being selected from at least one of the second light emitting element and the third light emitting element, and the plurality of data fan-out lines being electrically connected with the plurality of data lines.

An exemplary embodiment of the present disclosure further provides a display apparatus, which includes the display substrate in the above embodiments. The display apparatus may be any product or component with a display function, such as a mobile phone, a tablet computer, a television, a display, a notebook computer, a digital photo frame, a navigator, an advertising panel, a smart watch, an E-book portable multimedia player, or a display screen of various products of Internet of Things. In an exemplary implementation, the display apparatus may be a wearable display apparatus, which can be worn on a human body in some manners, such as a smart watch, a smart bracelet, etc.

The drawings of the present disclosure only involve the structures involved in the present disclosure, and for the other structures, reference may be made to conventional designs. The embodiments in the present disclosure, i.e., the features in the embodiments, may be combined to obtain new embodiments if there is no conflict.

It shall be understood by those of ordinary skills in the art that modifications or equivalent replacements may be made to the technical solutions of the present disclosure without departing from the spirit and scope of the technical solutions of the present disclosure, and the modifications or equivalent replacements shall all fall within the scope of the claims of the present disclosure.

The invention claimed is:

1. A display substrate, comprising:
a display area and a non-display area surrounding the display area, the display area comprising a first display region, a second display region and a fan-out wiring region, the second display region being located between the first display region and the fan-out wiring region; and a plurality of data lines located in the display area,
wherein the first display region comprises a plurality of first sub-pixels, the first sub-pixel comprises a first pixel circuit and a first light emitting element, and an orthographic projection of the first pixel circuit on the display substrate is at least partially overlapped with an orthographic projection of the first light emitting element on the display substrate;
the second display region comprises a plurality of second sub-pixels, the second sub-pixel comprises a second pixel circuit and a second light emitting element, and an orthographic projection of the second pixel circuit on the display substrate is at least partially overlapped with an orthographic projection of the second light emitting element on the display substrate;
the first pixel circuit and the second pixel circuit are electrically connected with the plurality of data lines;
the fan-out wiring region comprises a plurality of data fan-out lines and a plurality of third sub-pixels, the third sub-pixel comprises a third light emitting element, at least one second pixel circuit is electrically connected with at least two light emitting elements, the at least two light emitting elements are selected from at least one of the second light emitting element and the third light emitting element, and the plurality of data fan-out lines are electrically connected with the plurality of data lines; and
the display area comprises a first connecting line and a second connecting line, the first connecting line is configured to connect at least one of: the first pixel circuit and an anode of the first light emitting element, the second pixel circuit and an anode of the second light emitting element, and the second pixel circuit and an anode of the third light emitting element; and the second connecting line is configured to connect anodes of the at least two light emitting elements.

2. The display substrate according to claim 1, wherein the orthographic projection of the second pixel circuit on a display substrate plane is not overlapped with an orthographic projection of the third light emitting element on the display substrate plane.

3. The display substrate according to claim 1, wherein the data fan-out lines are stepped wiring, and an orthographic projection of the data fan-out lines on a display substrate plane is not overlapped with orthographic projections of the first pixel circuit and the second pixel circuit on the display substrate plane.

4. The display substrate according to claim 1, wherein materials of the first connecting line and the second connecting line are transparent conductive materials.

5. The display substrate according to claim 1, wherein the fan-out wiring region comprises a first color light emitting element, a second color light emitting element and a third color light emitting element, and the second connecting line is configured to connect anodes of at least two third color light emitting elements.

6. The display substrate according to claim 5, wherein the third color light emitting element is a green light emitting element.

7. The display substrate according to claim 5, wherein the third sub-pixel further comprises a third pixel circuit, and an orthographic projection of the third pixel circuit on the display substrate is at least partially overlapped with an orthographic projection of the first color light emitting element or the second color light emitting element on the display substrate, and is not overlapped with an orthographic projection of the third color light emitting element on the display substrate.

8. The display substrate according to claim 5, wherein the second connecting line is further configured to connect at least one of: anodes of at least two first color light emitting elements, and anodes of at least two second color light emitting elements.

9. The display substrate according to claim 1, wherein the data fan-out line comprises at least one transverse connecting portion and at least one longitudinal connecting portion, an orthographic projection of the transverse connecting portion on a display substrate plane is not overlapped with an orthographic projection of the third light emitting element on the display substrate plane, and there is at least an overlapping area between an orthographic projection of the longitudinal connecting portion on the display substrate plane and the orthographic projection of the third light emitting element on the display substrate plane.

10. The display substrate according to claim 1, wherein the display substrate comprises a light shielding layer, a first semiconductor layer, a first gate electrode layer, a second gate electrode layer, a second semiconductor layer, a third gate electrode layer, a source-drain electrode layer, and an anode stacked on a substrate, wherein
the first semiconductor layer comprises an active layer of at least one polysilicon transistor, the first gate electrode layer comprises a gate electrode of at least one polysilicon transistor and a plurality of first capacitor electrodes, the second gate electrode layer comprises a plurality of second capacitor electrodes, the second semiconductor layer comprises an active layer of at least one oxide transistor, the third gate electrode layer comprises a gate electrode of at least one oxide transistor, and the source-drain electrode layer comprises a plurality of data lines, and source electrodes and drain electrodes of a plurality of transistors; and
the plurality of data fan-out lines are arranged in a same layer as one or more of the light shielding layer, the first gate electrode layer, the second gate electrode layer and the third gate electrode layer.

11. The display substrate according to claim 10, further comprising an electrode connecting layer arranged between the source-drain electrode layer and the anode, and a material of the electrode connecting layer is indium tin oxide or indium zinc oxide.

12. The display substrate according to claim 10, wherein at least one third sub-pixel comprises any one or more of the following dummy electrode lines: a dummy active layer, a dummy gate electrode, a dummy capacitor electrode, and a dummy source-drain electrode, the dummy electrode lines being connected to a fixed potential signal line through a signal line.

13. A display apparatus, comprising the display substrate according to claim 1.

14. A method for preparing the display substrate of claim 1, comprising:
forming the plurality of first sub-pixels in the first display region, wherein each first sub-pixel comprises the first pixel circuit and the first light emitting element, the orthographic projection of the first pixel circuit on the display substrate is at least partially overlapped with the orthographic projection of the first light emitting element on the display substrate;
forming the plurality of second sub-pixels in the second display region, wherein each second sub-pixel comprises the second pixel circuit and the second light emitting element, the orthographic projection of the second pixel circuit on the display substrate is at least partially overlapped with the orthographic projection of the second light emitting element on the display substrate, the first pixel circuit and the second pixel circuit are electrically connected with the plurality of data lines; and
forming the plurality of third sub-pixels and the plurality of data fan-out lines in the fan-out wiring region, wherein each third sub-pixel comprises the third light emitting element, at least one of the second pixel circuit is electrically connected with at least two light emitting elements, the at least two light emitting elements are selected from at least one of the second light emitting element and the third light emitting element, and the plurality of data fan-out lines are electrically connected with the plurality of data lines.

15. A display substrate, comprising:
a display area and a non-display area surrounding the display area, the display area comprising a first display region, a second display region and a fan-out wiring region, the second display region being located between the first display region and the fan-out wiring region; and a plurality of data lines located in the display area,
wherein the first display region comprises a plurality of first sub-pixels, the first sub-pixel comprises a first pixel circuit and a first light emitting element, and an orthographic projection of the first pixel circuit on the display substrate is at least partially overlapped with an orthographic projection of the first light emitting element on the display substrate;
the second display region comprises a plurality of second sub-pixels, the second sub-pixel comprises a second pixel circuit and a second light emitting element, and an orthographic projection of the second pixel circuit on the display substrate is at least partially overlapped with an orthographic projection of the second light emitting element on the display substrate;
the first pixel circuit and the second pixel circuit are electrically connected with the plurality of data lines;
the fan-out wiring region comprises a plurality of data fan-out lines and a plurality of third sub-pixels, the third sub-pixel comprises a third light emitting element, at least one second pixel circuit is electrically connected with at least two light emitting elements, the at least two light emitting elements are selected from at least one of the second light emitting element and the third light emitting element, and the plurality of data fan-out lines are electrically connected with the plurality of data lines; and wherein the data fan-out line comprises at least one transverse connecting portion and at least one longitudinal connecting portion, an orthographic projection of the transverse connecting portion on a display substrate plane is not overlapped with an orthographic projection of the third light emitting element on the display substrate plane, and there is at least an overlapping area between an orthographic projection of the longitudinal connecting portion on the display substrate plane and the orthographic projection of the third light emitting element on the display substrate plane.

16. A display substrate, comprising:

a display area and a non-display area surrounding the display area, the display area comprising a first display region, a second display region and a fan-out wiring region, the second display region being located between the first display region and the fan-out wiring region; and a plurality of data lines located in the display area, wherein the first display region comprises a plurality of first sub-pixels, the first sub-pixel comprises a first pixel circuit and a first light emitting element, and an orthographic projection of the first pixel circuit on the display substrate is at least partially overlapped with an orthographic projection of the first light emitting element on the display substrate;

the second display region comprises a plurality of second sub-pixels, the second sub-pixel comprises a second pixel circuit and a second light emitting element, and an orthographic projection of the second pixel circuit on the display substrate is at least partially overlapped with an orthographic projection of the second light emitting element on the display substrate;

the first pixel circuit and the second pixel circuit are electrically connected with the plurality of data lines;

the fan-out wiring region comprises a plurality of data fan-out lines and a plurality of third sub-pixels, the third sub-pixel comprises a third light emitting element, at least one second pixel circuit is electrically connected with at least two light emitting elements, the at least two light emitting elements are selected from at least one of the second light emitting element and the third light emitting element, and the plurality of data fan-out lines are electrically connected with the plurality of data lines; and the at least one second pixel circuit being electrically connected with at least two light emitting elements comprises any one or more of the following:

two light emitting elements being connected in series and then connected with one second pixel circuit, the two light emitting elements being selected from at least one of the second light emitting element and the third light emitting element;

three light emitting elements being connected in series and then connected with one second pixel circuit, the three light emitting elements being selected from at least one of the second light emitting element and the third light emitting element;

four light emitting elements being connected in series and then connected with one second pixel circuit, the four light emitting elements being selected from at least one of the second light emitting element and the third light emitting element; and five light emitting elements being connected in series and then connected with one second pixel circuit, the five light emitting elements being selected from at least one of the second light emitting element and the third light emitting element.

17. A display substrate, comprising:

a display area and a non-display area surrounding the display area, the display area comprising a first display region, a second display region and a fan-out wiring region, the second display region being located between the first display region and the fan-out wiring region; and a plurality of data lines located in the display area, wherein the first display region comprises a plurality of first sub-pixels, the first sub-pixel comprises a first pixel circuit and a first light emitting element, and an orthographic projection of the first pixel circuit on the display substrate is at least partially overlapped with an orthographic projection of the first light emitting element on the display substrate;

the second display region comprises a plurality of second sub-pixels, the second sub-pixel comprises a second pixel circuit and a second light emitting element, and an orthographic projection of the second pixel circuit on the display substrate is at least partially overlapped with an orthographic projection of the second light emitting element on the display substrate;

the first pixel circuit and the second pixel circuit are electrically connected with the plurality of data lines;

the fan-out wiring region comprises a plurality of data fan-out lines and a plurality of third sub-pixels, the third sub-pixel comprises a third light emitting element, at least one second pixel circuit is electrically connected with at least two light emitting elements, the at least two light emitting elements are selected from at least one of the second light emitting element and the third light emitting element, and the plurality of data fan-out lines are electrically connected with the plurality of data lines;

the display substrate comprises a semiconductor layer, a first gate electrode layer, a second gate electrode layer, a first source-drain electrode layer, a second source-drain electrode layer, and an anode stacked on a substrate;

the semiconductor layer comprises active layers of a plurality of transistors, the first gate electrode layer comprises gate electrodes of a plurality of transistors and a plurality of first capacitor electrodes, the second gate electrode layer comprises a plurality of second capacitor electrodes, the first source-drain electrode layer comprises a plurality of data lines, and source electrodes and drain electrodes of a plurality of transistors, and the second source-drain electrode layer comprises a connecting electrode; and the plurality of data fan-out lines are arranged in a same layer as one or more of the first gate electrode layer, the second gate electrode layer and the second source-drain electrode layer.

18. The display substrate according to claim 17, further comprising an electrode connecting layer arranged between the source-drain electrode layer and the anode, and a material of the electrode connecting layer is indium tin oxide or indium zinc oxide.

19. The display substrate according to claim 17, wherein at least one third sub-pixel comprises any one or more of the following dummy electrode lines: a dummy active layer, a dummy gate electrode, a dummy capacitor electrode, and a dummy source-drain electrode, the dummy electrode lines being connected to a fixed potential signal line through a signal line.

20. The display substrate according to claim 17, wherein at least one third sub-pixel comprises a dummy data fan-out line connected to a fixed potential signal line through a signal line.

\* \* \* \* \*